US012489095B2

(12) United States Patent
Sato

(10) Patent No.: US 12,489,095 B2
(45) Date of Patent: Dec. 2, 2025

(54) SEMICONDUCTOR APPARATUS

(71) Applicant: FUJI ELECTRIC CO., LTD., Kawasaki (JP)

(72) Inventor: Kenichiro Sato, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 561 days.

(21) Appl. No.: 17/955,711

(22) Filed: Sep. 29, 2022

(65) Prior Publication Data

US 2023/0146272 A1 May 11, 2023

(30) Foreign Application Priority Data

Nov. 11, 2021 (JP) ................................ 2021-184007

(51) Int. Cl.
*H01L 23/50* (2006.01)
*H01L 21/48* (2006.01)
(Continued)

(52) U.S. Cl.
CPC ........ *H01L 25/162* (2013.01); *H01L 21/4817* (2013.01); *H01L 23/049* (2013.01);
(Continued)

(58) Field of Classification Search
CPC ... H01L 23/50; H01L 23/053; H01L 23/3735; H01L 23/49811; H01L 23/49838;
(Continued)

(56) References Cited

U.S. PATENT DOCUMENTS 5,519,252 A 5/1996 Soyano et al.
2003/0015778 A1 1/2003 Soyano et al.
(Continued)

FOREIGN PATENT DOCUMENTS

JP H06-045518 A 2/1994
JP 2003-249624 A 9/2003
(Continued)

OTHER PUBLICATIONS

Japanese Office Action mailed Oct. 7, 2025 for corresponding Japanese Application No. 2021-184007.

*Primary Examiner* — Jeff W Natalini
*Assistant Examiner* — Brandon C Fox

(57) ABSTRACT

A semiconductor apparatus includes a first connection terminal and a second connection terminal, a drive circuit including one or more power semiconductor elements, a control circuit to control the one or more power semiconductor elements, a circuit substrate, a passive element on the circuit substrate, and a first bus bar and a second bus bar. The first bus bar includes a first body including a path electrically connecting the first connection terminal to the drive circuit, and a first protrusion protruding toward the circuit substrate against the first body. The second bus bar includes a second body including a path electrically connecting the second connection terminal and the drive circuit, and a second protrusion protruding toward the circuit substrate against the second body. The passive element is electrically connected to the first protrusion and to the second protrusion.

14 Claims, 14 Drawing Sheets

(51) Int. Cl.

| | |
|---|---|
| ***H01L 23/049*** | (2006.01) |
| ***H01L 25/16*** | (2023.01) |
| ***H02K 11/33*** | (2016.01) |
| ***H02M 7/00*** | (2006.01) |
| *H01L 23/053* | (2006.01) |
| *H01L 23/373* | (2006.01) |
| *H01L 23/498* | (2006.01) |
| *H01L 23/538* | (2006.01) |
| *H05K 3/34* | (2006.01) |

(52) U.S. Cl.
CPC .............. *H01L 23/50* (2013.01); *H02K 11/33* (2016.01); *H02M 7/003* (2013.01); *H01L 23/053* (2013.01); *H01L 23/3735* (2013.01); *H01L 23/49811* (2013.01); *H01L 23/49838* (2013.01); *H01L 23/5386* (2013.01); *H05K 3/3405* (2013.01); *H05K 2201/10272* (2013.01)

(58) Field of Classification Search
CPC .... H01L 23/5386; H02K 11/33; H02M 7/003; H05K 3/3405; H05K 2201/10272
See application file for complete search history.

(56) References Cited

U.S. PATENT DOCUMENTS

| | | | | |
|---|---|---|---|---|
| 2008/0219623 | A1 | 9/2008 | Sklarek et al. | |
| 2018/0342440 | A1* | 11/2018 | Nishiyama | H01L 25/115 |
| 2020/0135668 | A1 | 4/2020 | Iwasaki | |
| 2021/0399647 | A1* | 12/2021 | Miyazaki | H02M 3/158 |
| 2022/0406689 | A1* | 12/2022 | Hori | H01L 23/49 |
| 2025/0202384 | A1* | 6/2025 | Asakura | H02M 7/487 |

FOREIGN PATENT DOCUMENTS

| | | | |
|---|---|---|---|
| JP | 2008-116962 | A | 5/2008 |
| JP | 2009-130163 | A | 6/2009 |
| JP | 2016-146444 | A | 8/2016 |
| JP | 2017-208987 | A | 11/2017 |
| JP | 2018-120914 | A | 8/2018 |
| JP | 2019-122175 | A | 7/2019 |
| JP | 2020-068299 | A | 4/2020 |

* cited by examiner

SEMICONDUCTOR APPARATUS

CROSS REFERENCE TO RELATED APPLICATION

This application is based on, and claims priority from, Japanese Patent Application No. 2021-184007, filed Nov. 11, 2021, the entire content of which is incorporated herein by reference.

BACKGROUND

Technical Field

This disclosure relates to a semiconductor apparatus with power semiconductor elements.

Related Art

For example, a semiconductor apparatus has been proposed with a power semiconductor element such as an insulated gate bipolar transistor (IGBT). For example, Japanese Patent Application Laid-Open Publication No. 2017-208987 discloses a power conversion apparatus including a first substrate, on which switching elements are mounted, and a second substrate on which a capacitive element is mounted. The switching elements and the capacitive element are electrically connected to each other through dedicated wires extending from the first substrate to the second substrate.

In a configuration disclosed in Japanese Patent Application Laid-Open Publication No. 2017-208987, linear wires, which are separate from elements on the first substrate or are separate from elements on the second substrate, are required to be coupled to both the first substrate and the second substrate. Therefore, it is difficult to simplify the manufacturing process of the apparatus.

SUMMARY

In view of the circumstances described above, an object of one aspect according to the present disclosure is to simplify a manufacturing process of a semiconductor apparatus. To solve the above problem, a semiconductor apparatus according to the present disclosure includes a first connection terminal and a second connection terminal, a drive circuit including one or more power semiconductor elements, a control circuit configured to control the one or more power semiconductor elements, a circuit substrate, a passive element on the circuit substrate, and a first bus bar and a second bus bar. The first bus bar includes a first body including a path electrically connecting the first connection terminal to the drive circuit, and a first protrusion protruding toward the circuit substrate against the first body. The second bus bar includes a second body including a path electrically connecting the second connection terminal and the drive circuit, and a second protrusion protruding toward the circuit substrate against the second body. The passive element is electrically connected to the first protrusion and to the second protrusion.

DESCRIPTION OF EMBODIMENTS

Embodiments according to the present disclosure will be described with reference to the drawings. In each drawing, dimensions and scales of elements may differ from those of actual products. In addition, each embodiment described below is an exemplary embodiment assumed in a case in which the present disclosure is implemented. Therefore, the scope of the present disclosure is not limited to the embodiments described below.

A: First Embodiment

Figure 1:
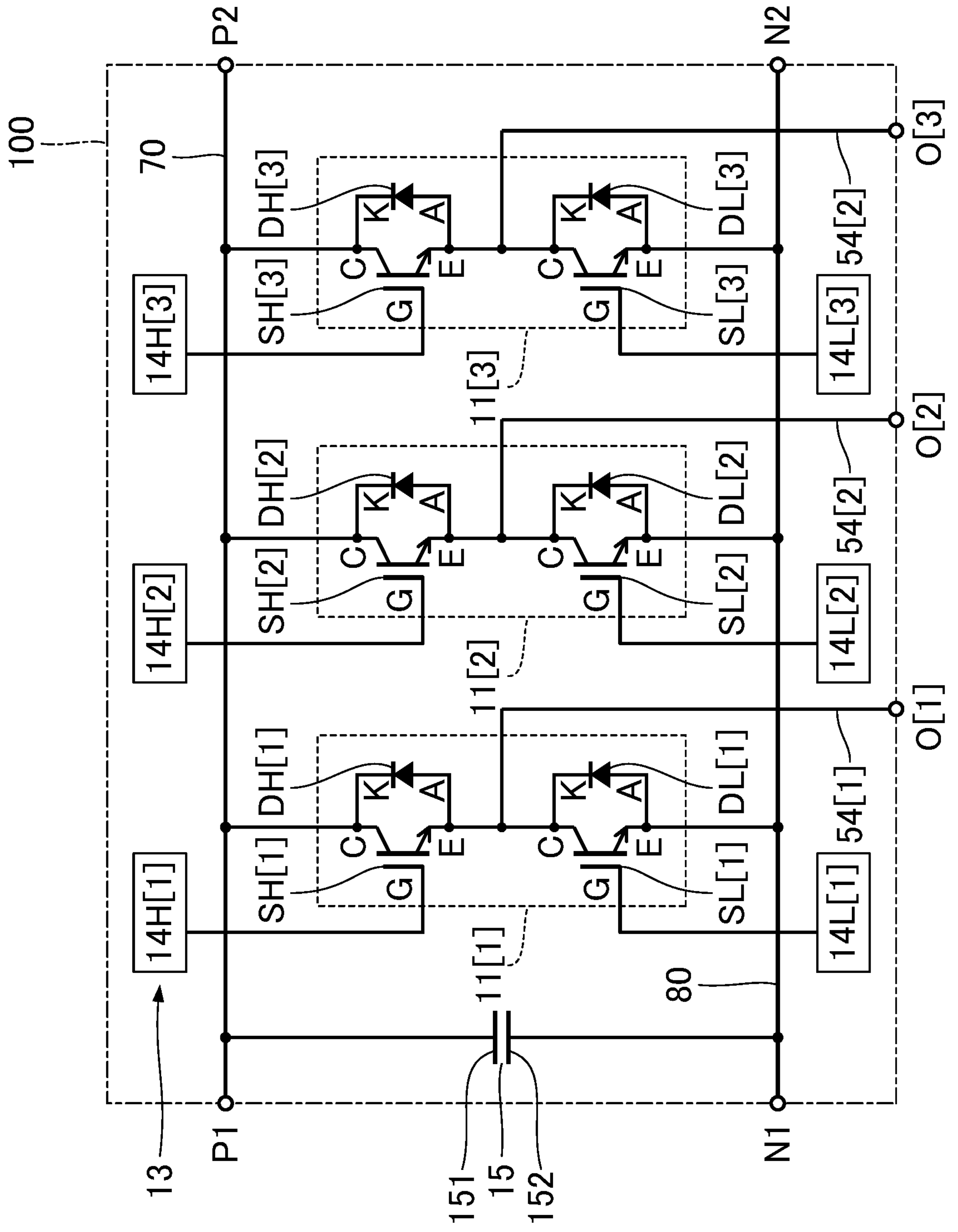
FIG. 1 is a circuit diagram showing an electrical configuration of a semiconductor apparatus according to a first embodiment.

FIG. 1 is a circuit diagram showing an electrical configuration of a semiconductor apparatus 100. The semiconductor apparatus 100 is a power semiconductor module used as a three-phase inverter circuit configured to drive an electric motor such as a three-phase motor, etc. As shown in FIG. 1, the semiconductor apparatus 100 includes connection terminals P (P1, P2), connection terminals N (N1, N2), three output terminals O[1] to O[3], three drive circuits 11[1] to 11[3], a control circuit 13, and a capacitive element 15.

The connection terminals P (P1, P2) are positive input terminals (P terminals) for electrically connecting the respective drive circuits 11[*k*] (k=1 to 3) to an external device (not shown). The connection terminals N (N1, N2) are negative input terminals (N terminals) for electrically connecting the respective drive circuit 11[*k*] to the external device. To each connection terminal P, a voltage higher than a voltage applied to each connection terminal N is applied. Each connection terminal P is an example of a "first connection terminal," and each connection terminal N is an example of a "second connection terminal."

Each output terminal O[k] is a terminal electrically connected to a respective input terminal of an electric motor to be driven. Power required to drive the electric motor is supplied from each output terminal O[k] to the electric motor. The three output terminals O[1] to O[3] correspond to output terminals included in a three-phase inverter circuit having a U-phase, a V-phase, and a W-phase.

Each drive circuit 11[*k*] is a circuit configured to control a current supplied from the output terminal O[k] to the electric motor. The three drive circuits 11[1] to 11[3] correspond to drive circuits included in the three-phase inverter circuit, the drive circuits including a drive circuit for the U-phase, a drive circuit for the V-phase, and a drive circuit for the W-phase. Each drive circuit 11[*k*] is electrically connected to the respective connection terminals P via a high potential bus bar 70, and each drive circuit 11[*k*] is electrically connected to the respective connection terminals N via a low potential bus bar 80. The high potential bus bar 70 is a line for electrically connecting each connection terminal P to each drive circuit 11[*k*]. The low potential bus bar 80 is a line for electrically connecting each connection terminal N to each drive circuit 11[*k*]. Electric potential at the high potential bus bar 70 is set to be higher than electric potential at the low potential bus bar 80. The high potential bus bar 70 is an example of a "first bus bar," and the low potential bus bar 80 is an example of a "second bus bar." The number of drive circuits 11[*k*] mounted on the semiconductor apparatus 100 may be freely selected, and the number of drive circuits 11[*k*] mounted on the semiconductor apparatus 100 is not limited to "three" as described in the first embodiment.

The semiconductor apparatus 100 includes six switching elements S (SH[1] to SH[3], SL[1] to SL[3]) and six diode elements D (DH[1] to DH[3], DL[1] to DL[3]). Each switching element S is a transistor including a main electrode E, a main electrode C, and a control electrode G.

Each diode element D is a rectifier element including an anode A and a cathode K. Each of the switching element S and the diode element D is an example of a "power semiconductor element." The number or type of power semiconductor elements included in the drive circuit 11[*k*] is not limited to the example of the first embodiment.

Each drive circuit 11[*k*] is a half bridge circuit including two switching elements S (SH[k], SL[k]) and two diode elements D (DH[k], DL[k]). The main electrode C of the switching element SH[k] on a high potential side is electrically connected to the high potential bus bar 70, and the main electrode E of the switching element SL[k] on a low potential side is electrically connected to the low potential bus bar 80. The main electrode E of the switching element SH[k] and the main electrode C of the switching element SL[k] are electrically connected to an output side bus bar 54[*k*]. The output side bus bar 54[*k*] is a line for electrically connecting the drive circuit 11[*k*] to the output terminal O[k]. In addition, the diode element DH[k] is connected in parallel to the switching element SH[k], and the diode element DL[k] is connected in parallel to the switching element SL[k].

The control circuit 13 is a circuit configured to control each switching element S (SH[1] to SH[3], SL[1] to SL[3]). The control circuit 13 includes six control chips 14 (14H[1] to 14H[3], 14L[1] to 14L[3]) corresponding to the respective switching elements S. Each control chip 14H[k] is a high voltage IC (HVIC) configured to control the switching element SH[k] on the high potential side. Each control chip 14L[k] is a low voltage IC (LVIC) configured to control the switching element SL[k] on the low potential side.

The capacitive element 15 is a passive element electrically connected to the high potential bus bar 70 and the low potential bus bar 80. Specifically, the capacitive element 15 includes a first electrode 151 and a second electrode 152. The first electrode 151 is electrically connected to the high potential bus bar 70, and the second electrode 152 is electrically connected to the low potential bus bar 80. According to a configuration in which the capacitive element 15 is connected between the high potential bus bar 70 and the low potential bus bar 80 as described above, it is possible to change the frequency characteristics of noise caused by switching the switching element S. Specifically, it is possible to change a frequency having a peak in the frequency characteristics of the noise. The capacitive element 15 may be used as a snubber capacitor configured to reduce a surge voltage momentarily generated at the semiconductor apparatus 100. However, to reduce the surge voltage sufficiently, the large capacitive element 15 is required. Therefore, from a viewpoint of downsizing the semiconductor apparatus 100, a configuration is preferable in which a large snubber capacitor separate from the capacitive element 15 is attached externally to the semiconductor apparatus 100.

Figure 2:
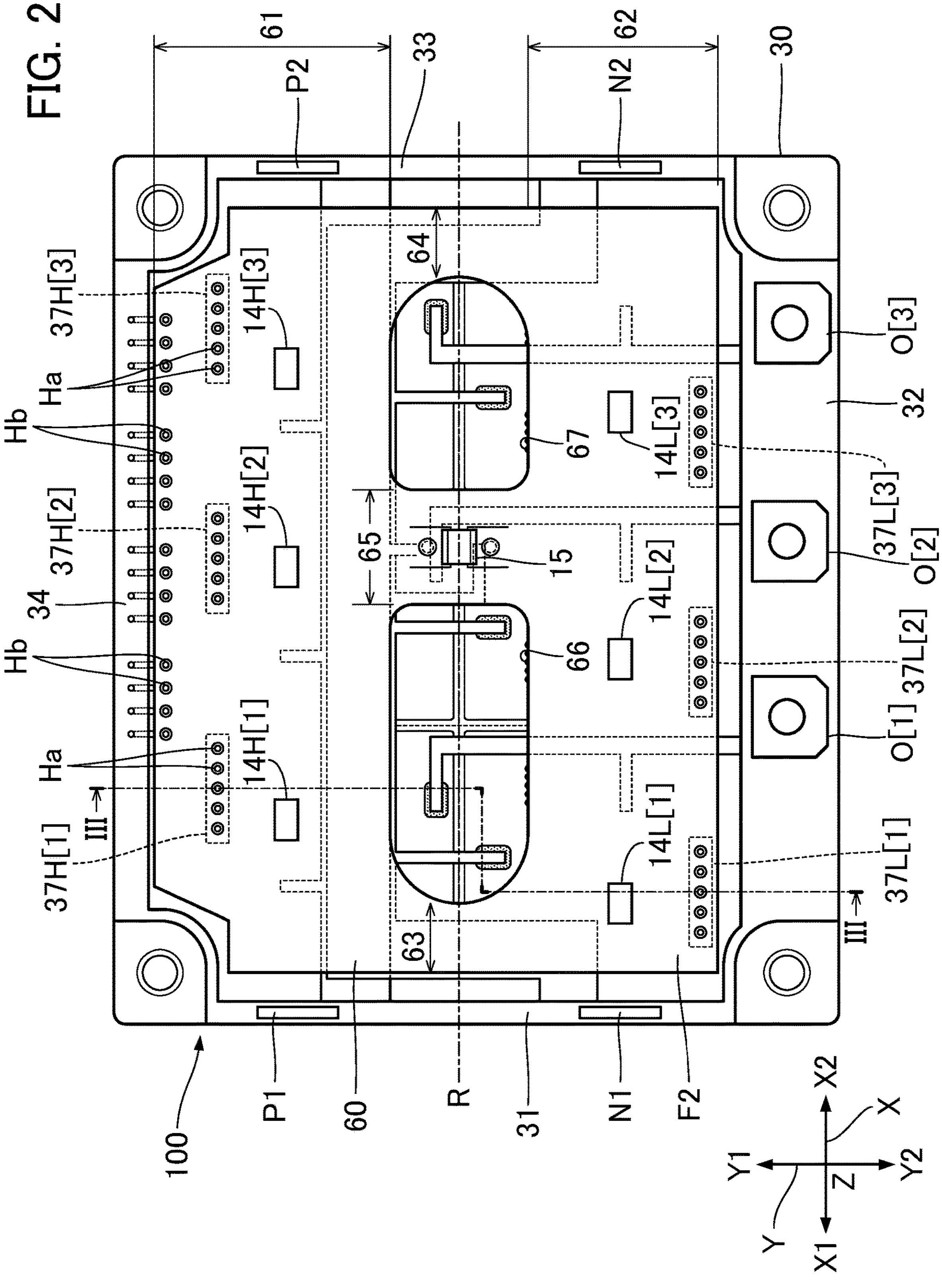
FIG. 2 is a plan view showing a configuration of the semiconductor apparatus.
Figure 3:
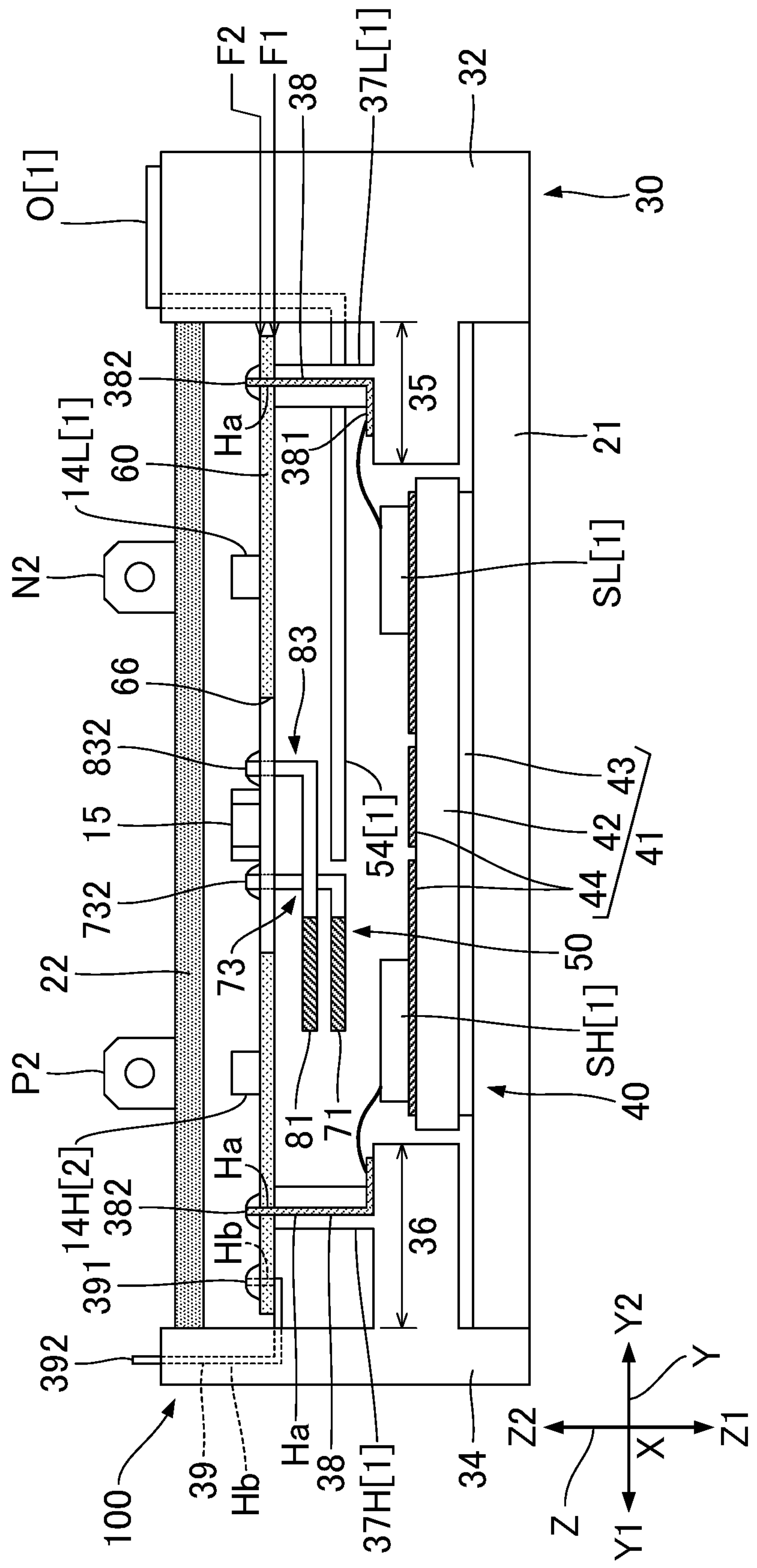
FIG. 3 is a cross section taken along line III-III in FIG. 2.
Figure 4:
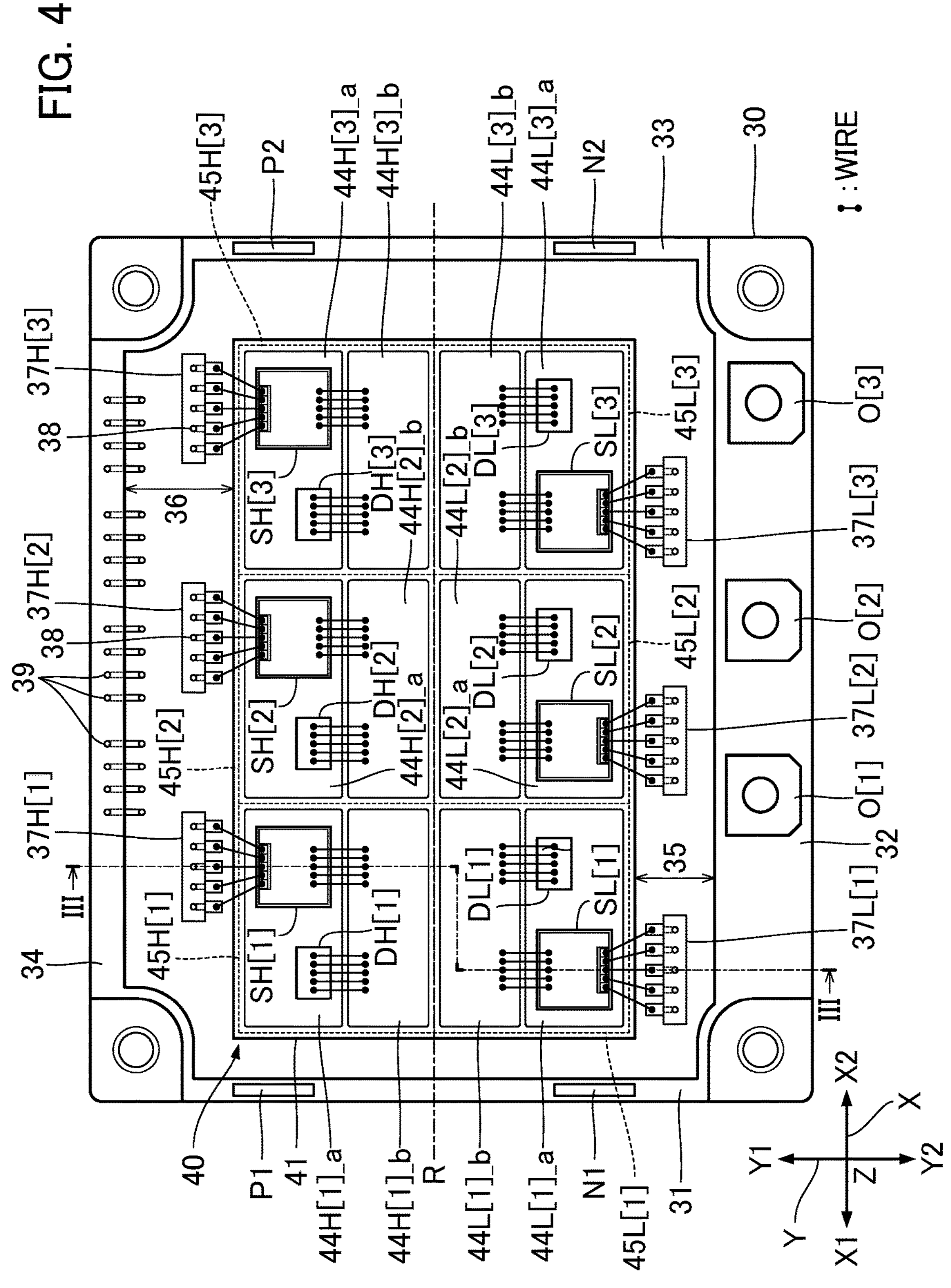
FIG. 4 is a plan view showing configurations of a semiconductor unit and a housing.
Figure 5:
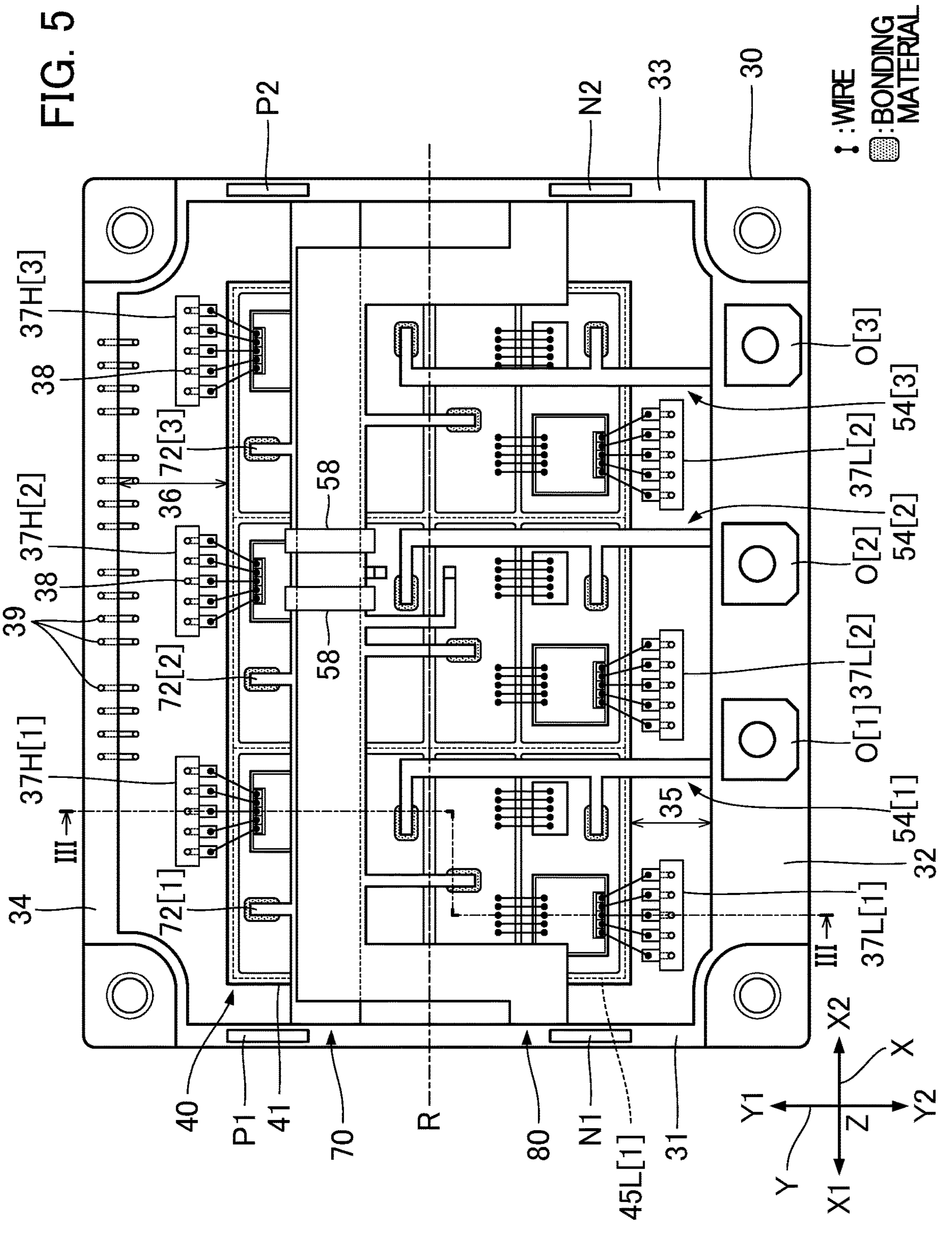
FIG. 5 is a plan view showing the configuration of the semiconductor apparatus focusing on a connecting conductor.

FIG. 2 is a plan view showing the configuration of the semiconductor apparatus 100. FIG. 3 is a cross section taken along line III-III in FIG. 2. In FIG. 4 and FIG. 5 described below, as in FIG. 2, a cut line corresponding to the cross section in FIG. 3 is shown.

In the following description, as shown in FIG. 2 and FIG. 3, an X-axis, a Y-axis, and a Z-axis are defined that are perpendicular to each other. A direction along the X-axis is described as an X1 direction, and a direction opposite to the X1 direction is described as an X2 direction. In other words, a direction of the X-axis is described as a longitudinal direction of the semiconductor apparatus 100 (that is, a direction of a long side in an external form of the semiconductor apparatus 100). A direction along the Y-axis is described as a Y1 direction, and a direction opposite to the Y1 direction is described as a Y2 direction. Similarly, a direction along the Z-axis is described as a Z1 direction, and a direction opposite to the Z1 direction is described as a Z2 direction. In addition, viewing an element, which is freely selected from the semiconductor apparatus 100, along a direction of the Z-axis (Z1 direction or Z2 direction) is referred to as "plan view" in the following.

In actual use, the semiconductor apparatus 100 is capable of being mounted in a freely selected direction; however, for convenience in the following description, the Z1 direction is assumed to be downward and the Z2 direction is assumed to be upward. Therefore, a surface, which faces in the Z1 direction, of a freely selected element of the semiconductor apparatus 100 may be described as a "lower surface" and a surface, which faces in the Z2 direction, of the element may be described as an "upper surface." In addition, as shown in FIG. 2, a virtual plane (hereinafter referred to as a "reference plane") R parallel to an XZ plane is assumed in the following description. The reference plane R is located at a center of the semiconductor apparatus 100 in a direction of the Y-axis. In other words, the reference plane R is a plane dividing the semiconductor apparatus 100 in half in the direction of the Y-axis.

As shown in FIG. 3, the semiconductor apparatus 100 according to the first embodiment includes a base 21, a lid 22, a housing 30, a semiconductor unit 40, a connecting conductor 50, and a circuit substrate 60. The connecting conductor 50 is located between the semiconductor unit 40 and the circuit substrate 60. The circuit substrate 60 is located between the connecting conductor 50 and the lid 22. In FIG. 2, the lid 22 is omitted for convenience.

The base 21 in FIG. 3 is a rectangular plate-shaped member supporting the semiconductor unit 40, and the base 21 is formed of, for example, a conductive material such as an aluminum material, a copper material, etc. The base 21 is used as a heat sink to radiate heat generated in the semiconductor unit 40, as well. For example, a cooler such as a fin or a water-cooled jacket that cools the semiconductor unit 40 may be used as the base 21. The base 21 may be used as a grounding body that is set at a ground potential.

The housing 30 houses the semiconductor unit 40, the connecting conductor 50, and the circuit substrate 60. The housing 30 is formed of, for example, a resin material such as polyphenylene sulfide (PPS) resin, polybutylene terephthalate (PBT) resin, polybutylene succinate (PBS) resin, polyamide (PA) resin, or acrylonitrile-butadiene-styrene (ABS) resin, etc.

FIG. 4 is a plan view showing configurations of the semiconductor unit 40 and the housing 30. In other words, FIG. 4 shows a state in which the connecting conductor 50 and the circuit substrate 60 are removed from FIG. 2. As shown in FIG. 4, the housing 30 includes a side wall 31, a side wall 32, a side wall 33, a side wall 34, an overhang 35, and an overhang 36. The side wall 31, the side wall 32, the side wall 33, and the side wall 34 interconnect to form a rectangular frame-shaped structure. The side wall 31 and the side wall 33 are wall-shaped portions, which are spaced apart from each other in the direction of the X-axis, extending in the direction of the Y-axis. On the other hand, the side wall 32 and the side wall 34 are wall-shaped portions, which are spaced apart from each other in the direction of the Y-axis, extending in the direction of the X-axis. The side wall 32 and the side wall 34 each have a shape for connecting respective ends of the side wall 31 to respective ends of the side wall 33.

The overhang 35 is a flat plate-shaped portion protruding in the Y1 direction from an inner wall surface of the side wall 32. The overhang 36 is a flat plate-shaped portion protruding in the Y2 direction from an inner wall surface of the side wall 34. Each of the overhang 35 and the overhang 36 extends in the direction of the X-axis from an inner circumferential surface of the side wall 31 to an inner circumferential surface of the side wall 33. As shown in FIG. 3, in the Z1 direction from the overhang 35 and the overhang 36, the base 21 is fixed in a space surrounded by the side wall 31, the side wall 32, the side wall 33, and the side wall 34. The semiconductor unit 40, the connecting conductor 50, and the circuit substrate 60 are housed in a space surrounded by an upper surface of the base 21, the side wall 31, the side wall 32, the side wall 33, and the side wall 34. As shown in FIG. 3, the semiconductor unit 40 is located between the overhang 35 and the overhang 36. The lid 22 in FIG. 3 is fixed to the housing 30 to cover a space (opening) surrounded by the side wall 31, the side wall 32, the side wall 33, and the side wall 34. In other words, the base 21 and the lid 22 face each other across a space. In the space between the base 21 and the lid 22, the semiconductor unit 40, the connecting conductor 50, and the circuit substrate 60 are housed.

In a space surrounded by the housing 30, an encapsulating material (not shown) may be formed. The encapsulating material encapsulates the semiconductor unit 40, the connecting conductor 50, and the circuit substrate 60. The encapsulating material is formed of, for example, a resin material such as a silicone gel or an epoxy resin, etc. The encapsulating material may include various insulating fillers such as a silicon oxide or an aluminum oxide, etc., in addition to a resin material.

As shown in FIG. 4, the housing 30 includes respective supports 37 (37H[1] to 37H[3], 37L[1] to 37L[3]) corresponding to the respective switching elements S. On an upper surface of the overhang 36, the three supports 37H[1] to 37H[3] corresponding to the respective switching elements SH[k] are formed. Each support 37H[k] is a prism-shaped portion protruding in the Z2 direction from the upper surface of the overhang 36, and each support 37H[k] is integrally formed with the overhang 36. On the other hand, on an upper surface of the overhang 35, the three supports 37L[1] to 37L[3] corresponding to the respective switching elements SL[k] are formed. Each support 37L[k] is a prism-shaped portion protruding in the Z2 direction from the upper surface of the overhang 35, and each support 37L[k] is integrally formed with the overhang 35.

As shown in FIG. 3 and FIG. 4, a plurality of control terminals 38 is mounted at each support 37. The control terminals 38 mounted at each support 37 are each a conductor, which has a circular cross sectional, for supplying the control chip 14 with a control signal for controlling the respective switching element S. As shown in FIG. 3, the control terminal 38 includes a lower end 381 protruding from a side surface of the support 37 and an upper end 382 protruding in the Z2 direction from an upper surface of the support 37.

In addition, a plurality of external terminals 39 is installed in the side wall 34 of the housing 30. Each external terminal 39 is a conductor, which has a circular cross sectional, for supplying the semiconductor apparatus 100 with the control signal for controlling the respective switching element S from an external apparatus. The respective control signals supplied to the respective external terminals 39 are transmitted to the respective control terminals 38 via the circuit substrate 60, and then the respective control signals are transmitted from the respective control terminals 38 to the respective control chips 14 via the circuit substrate 60. Each external terminal 39 includes a lower end 391 protruding from an inner wall surface of the housing 30 (side wall 32, 34) and an upper end 392 protruding in the Z2 direction from an upper surface of the housing 30. Each control terminal 38 and each external terminal 39 are integrally formed with the housing 30, for example, by insert molding.

As shown in FIGS. 3 and 4, the semiconductor unit 40 includes a mounting substrate 41, the six switching elements S (SH[1] to SH[3], SL[1] to SL[3]), and the six diode elements D (DH[1] to DH[3], DL[1] to DL[3]). Each switching element S and each diode element D are installed on the mounting substrate 41.

The mounting substrate 41 is a rectangular plate-shaped member supporting each drive circuit 11[*k*]. For example, a laminated ceramic substrate such as a direct copper bonding (DCB) substrate or an active metal brazing (AMB) substrate, etc., or a metal base substrate including a resin insulating layer, is used as the mounting substrate 41.

The mounting substrate 41 is a laminated substrate constituted by stacking an insulating substrate 42, a metallic layer 43, and a plurality of conductive patterns 44 (44H[k]_a, 44H[k]_b, 44L[k]_a, 44L[k]_b). The insulating substrate 42 is a rectangular plate-shaped member formed of an insulating material. The material of the insulating substrate 42 is freely selected, and the material of the insulating substrate 42 may be, for example, a ceramic material such as alumina ($Al_2O_3$), aluminum nitride (AlN) or silicon nitride ($Si_3N_4$), or a resin material such as an epoxy resin, etc.

The metallic layer 43 is a conductive film formed on a lower surface of the insulating substrate 42, which faces the base 21. The metallic layer 43 is formed on some or all of the lower surface of the insulating substrate 42. A lower surface of the metallic layer 43 is in contact with the upper surface of the base 21. The metallic layer 43 is formed of, for example, a metallic material with high thermal conductivity, such as a copper material, or an aluminum material, etc.

As shown in FIG. 4, an upper surface of the insulating substrate 42 is divided into six mounting areas 45 (45H[1] to 45H[3], 45L[1] to 45L[3]) corresponding to the respective switching elements S. The three mounting areas 45H[1] to 45H[3] are aligned in the direction of the X-axis in plan view. Similarly, the three mounting areas 45L[1] to 45L[3] are aligned in the direction of the X-axis in plan view. In the Y1 direction, the three mounting areas 45H[1] to 45H[3] are in front of the reference plane R, and in the Y2 direction, the three mounting areas 45L[1] to 45L[3] are in front of the reference plane R. A boundary between the three mounting areas 45H[1] to 45H[3] on the high potential side and the three mounting areas 45L[1] to 45L[3] on the low potential side may be expressed as the reference plane R.

Each conductive pattern 44 is a conductive film formed on the upper surface of the insulating substrate 42. For example, the conductive pattern 44 is formed by a low-resistance conductive material such as a copper material or an alloy of copper, etc. As shown in FIG. 4, on each mounting area 45H[k], a conductive pattern 44H[k]_a and a conductive pattern 44H[k]_b are formed at a distance from each other. Similarly, on each mounting area 45L[k], a conductive pattern 44L[k]_a and a conductive pattern 44L[k]_b are formed at a distance from each other.

Each switching element S (SH[1] to SH[3], SL[1] to SL[3]) is a power semiconductor element capable of switching between conduction of an electric current and interruption of the electric current, and each switching element S is coupled to the mounting substrate 41 via a bonding material (not shown) such as solder, etc. Each switching element S according to the first embodiment is an insulated gate bipolar transistor (IGBT). Each switching element S is a semiconductor chip including the main electrode E, the main electrode C, and the control electrode G. The main electrode E and the main electrode C are electrodes to which a current, to be controlled, is input or output. Specifically, the main electrode E is an emitter electrode formed on an upper surface of the switching element S, and the main electrode C is a collector electrode formed on a lower surface of the switching element S. On the other hand, the control electrode G is a gate electrode to which a voltage for control of the turning on and off of the switching element S is applied, and the control electrode G is formed on the upper surface of the switching element S. The control electrode G may include a detection electrode used to detect a current or temperature, etc.

Each switching element SH[k] is coupled to the conductive pattern 44H[k]_a in the mounting area 45H[k]. In other words, the main electrode C of the switching element SH[k] is coupled to the conductive pattern 44H[k]_a. In addition, each switching element SL[k] is coupled to the conductive pattern 44L[k]_a in the mounting area 45L[k]. In other words, the main electrode C of the switching element SL[k] is coupled to the conductive pattern 44L[k]_a.

Each diode element D (DH[1] to DH[3], DL[1] to DL[3]) is a power semiconductor element configured to rectify a current, and each diode element D is coupled to the mounting substrate 41 via, for example, a bonding material (not shown) such as solder, etc. Each diode element D is a semiconductor chip including an anode A and a cathode K. The anode A is formed on an upper surface of the diode element D, and the cathode K is formed on a lower surface of the diode element D.

Each diode element DH[k] is coupled to the conductive pattern 44H[k]_a in the mounting area 45H[k]. In other words, the cathode K of the diode element DH[k] is coupled to the conductive pattern 44H[k]_a. Similarly, each diode element DL[k] is coupled to the conductive pattern 44L[k]_a in the mounting area 45L[k]. In other words, the cathode K of the diode element DL[k] is coupled to the conductive pattern 44L[k]_a.

In the above configuration, the main electrode E of each switching element SH[k] is electrically connected to the conductive pattern 44H[k]_b in the mounting area 45H[k] by a plurality of wires. The control electrode G of each switching element SH[k] is electrically connected to the respective control terminal 38 in the support 37H[k] by a plurality of wires. Specifically, the control electrode G is electrically connected to the lower end 381 of the respective control terminal 38 by a wire. The anode A of each diode element DH[k] is electrically connected to the conductive pattern 44H[k]_b by a plurality of wires. Similarly, the main electrode E of each switching element SL[k] is electrically connected to the conductive pattern 44L[k]_b in the mounting area 45L[k]_b by a plurality of wires. The control electrode G of each switching element SL[k] is electrically connected to the respective control terminal 38 (lower end 381) of the support 37L[k] by a plurality of wires. The anode A of each diode element DL[k] is electrically connected to the conductive pattern 44L[k]_b by a plurality of wires.

As shown in FIG. 2 to FIG. 4, the connection terminal P1 and the connection terminal N1 are mounted on the side wall 31 of the housing 30. Specifically, in the Y1 direction, the connection terminal P1 is in front of the reference plane R, and in the Y2 direction, the connection terminal N1 is in front of the reference plane R. In addition, the connection terminal P2 and the connection terminal N2 are mounted on the side wall 33 of the housing 30. Specifically, in the Y1 direction, the connection terminal P2 is in front of the reference plane R, and in the Y2 direction, the connection terminal N2 is in front of the reference plane R.

Figure 6:
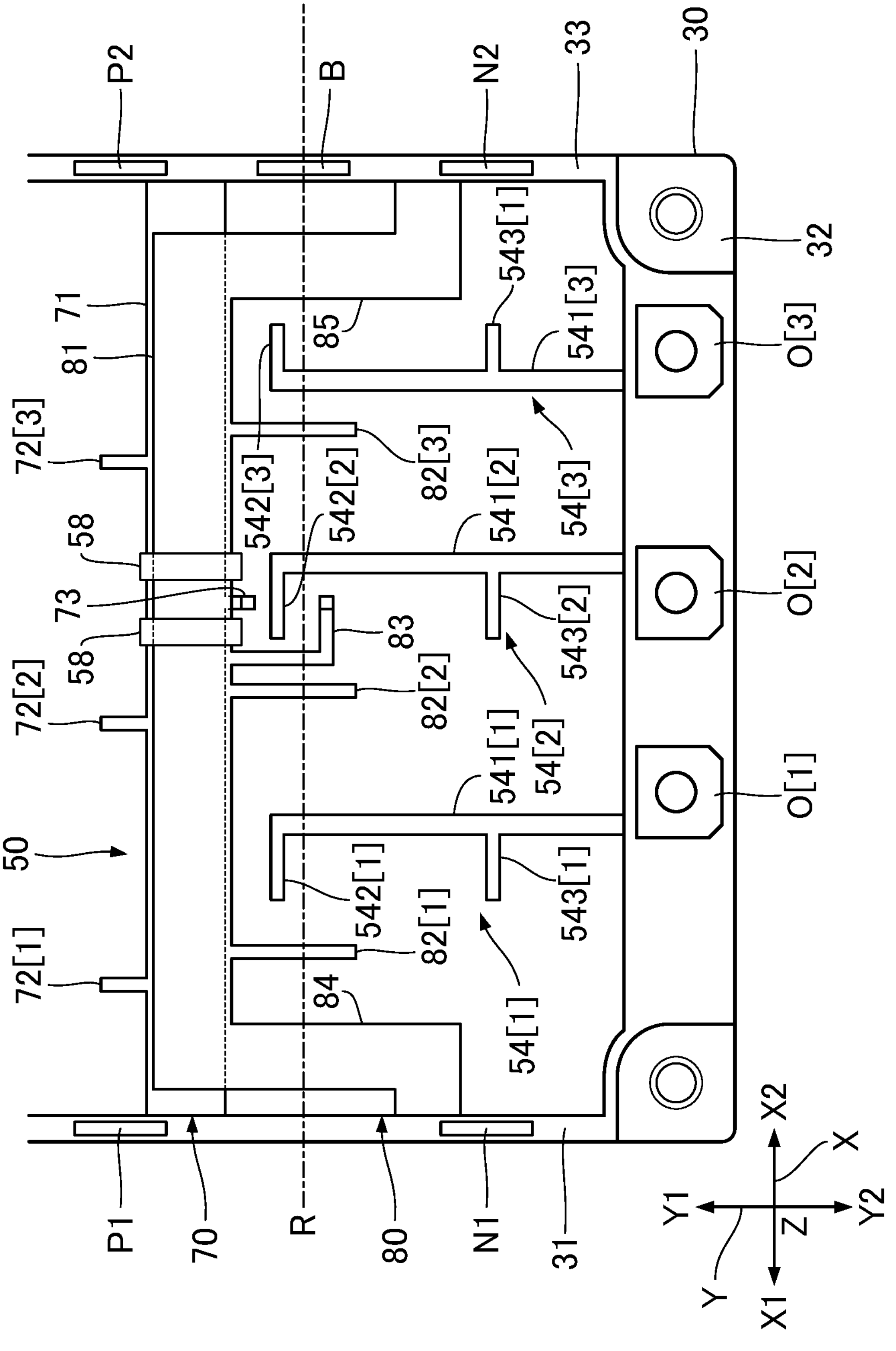
FIG. 6 is a plan view of the configuration in FIG. 5 in which the semiconductor unit is omitted.

FIG. 5 is a plan view showing the configuration of the semiconductor apparatus 100 focusing on the connecting conductor 50. FIG. 5 shows a state in which the circuit substrate 60 is omitted from FIG. 2. FIG. 6 is a plan view of the configuration in FIG. 5 in which the semiconductor unit 40 is omitted. As shown in FIG. 5 and FIG. 6, the connecting conductor 50 in FIG. 2 includes the high potential bus bar 70, the low potential bus bar 80, and three output side bus bars 54[1] to 54[3]. Each bus bar is a plate-shaped or bar-shaped conductor for conducting a large current, and each bus bar is formed of, for example, a conductive material such as a copper material, or an aluminum material, etc. As described above with reference to FIG. 1, the high potential bus bar 70 is a conductor for electrically connecting the three drive circuits 11[1] to 11[3] to the connection terminal P1 and the connection terminal P2. On the other hand, the low potential bus bar 80 is a conductor for electrically connecting the three drive circuits 11[1] to 11[3] to the connection terminal N1 and the connection terminal N2.

As shown in FIG. 6, the high potential bus bar 70 is a structure including a body 71, three connector portions 72 (72[1] to 72[3]), and one connector portion 73. The body 71, the respective connector portions 72, and the connector portion 73 are constructed as a single unit. For example, the high potential bus bar 70 is formed by bending a metal plate, which has a predetermined flat shape, by press working. The high potential bus bar 70 is located between the mounting substrate 41 and the circuit substrate 60.

The body 71 extends in the direction of the X-axis. Specifically, the body 71 extends linearly in the direction of the X-axis from the side wall 31 to the side wall 33 facing the side wall 31. One end of the body 71 is connected to the connection terminal P1, and the other end of the body 71 is connected to the connection terminal P2. Specifically, the end of the body 71 extending in the X1 direction is connected to the connection terminal P1, and the end of the body 71 extending in the X2 direction is connected to the connection terminal P2.

Each connector portion 72 is a portion for electrically connecting the mounting substrate 41 (conductive patterns 44) to the body 71. Each connector portion 72 branches in the Y1 direction from the body 71. Specifically, each connector portion 72[*k*] branches in the Y1 direction from a portion of the body 71 corresponding to the mounting area 45H[k] in plan view, and each connector portion 72[*k*] is electrically connected to the conductive pattern 44H[k]_a in the mounting area 45H[k].

Figure 7:
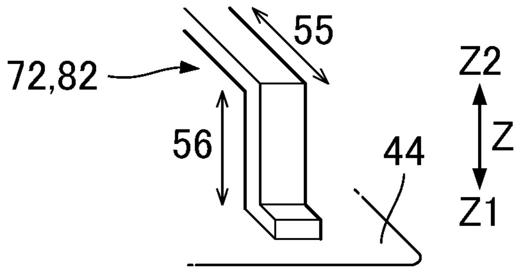
FIG. 7 is a perspective view showing a relationship between a connector portion and a mounting substrate.

FIG. 7 is a perspective view showing a relationship between each connector portion 72 (72[1] to 72[3]) and the mounting substrate 41. As shown in FIG. 7, the connector portion 72 includes an extension portion 55 and a terminal portion 56. The extension portion 55 is a portion branching sideways from a side surface of the body 71, and the extension portion 55 extends in a direction parallel to an XY plane. The terminal portion 56 is a portion protruding in the Z1 direction from a tip of the extension portion 55 toward the mounting substrate 41. A tip of the terminal portion 56 is coupled to the conductive pattern 44 using, for example, a bonding material such as solder, etc. As will be understood from the above description, the connector portion 72 protrudes from the body 71 toward the mounting substrate 41, and the connector portion 72 is electrically connected to the drive circuit 11[*k*]. The body 71 is an example of a "first body" and the connector portion 72 is an example of a "first connector portion.

The connector portion 73 in FIG. 6 is a portion for electrically connecting the circuit substrate 60 to the body 71. The connector portion 73 branches from the body 71. Specifically, the connector portion 73 is a portion branching in the Y2 direction from a vicinity of a center of the body 71 in the direction of the X-axis.

Figure 8:
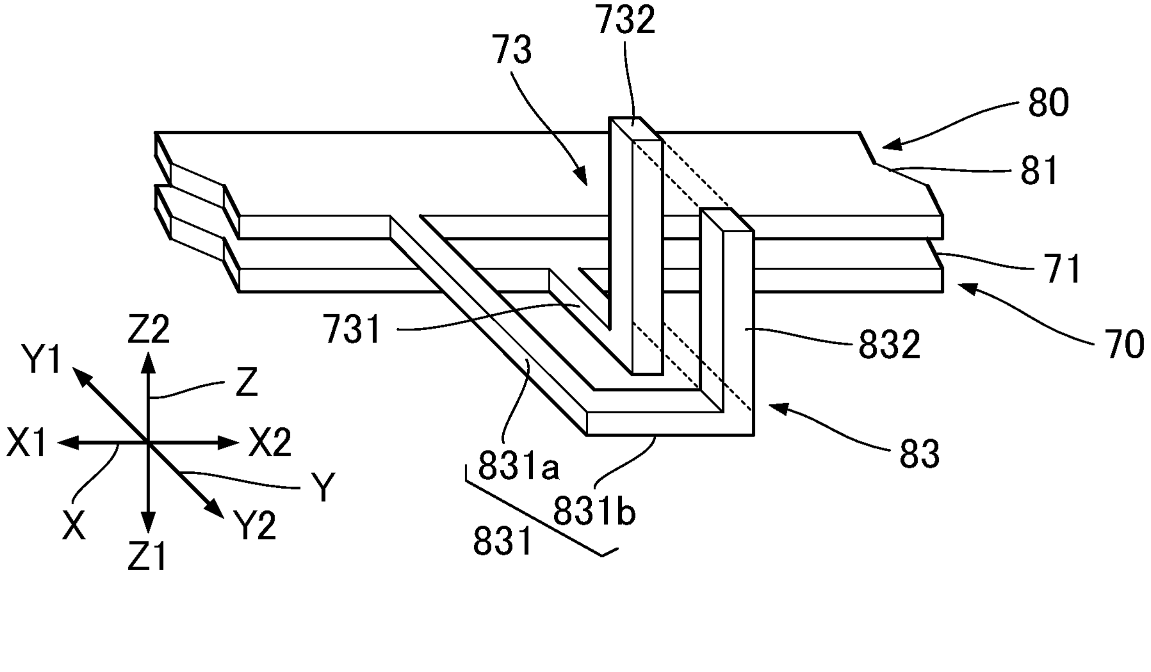
FIG. 8 is a perspective view showing an enlarged portion of a high potential bus bar and an enlarged portion of a low potential bus bar.

FIG. 8 is a perspective view showing an enlarged portion of the high potential bus bar 70 and an enlarged portion of the low potential bus bar 80. As shown in FIG. 8, the connector portion 73 includes an extension portion 731 and a protrusion 732. The extension portion 731 is a portion branching from the body 71, and the extension portion 731 extends in the direction parallel to the XY plane. Specifically, the extension portion 731 extends linearly in the Y2 direction from the body 71. The protrusion 732 is a portion protruding in the Z2 direction from a tip of the extension portion 731 toward the circuit substrate 60. Specifically, the protrusion 732 is a portion bent from the extension portion 731. In other words, the protrusion 732 is formed by bending a straight portion, which branches sideways from the body 71, in the Z2 direction by press working, for example. Therefore, a cross sectional shape of the protrusion 732 is rectangular. According to the above configuration, it is possible to form the protrusion 732 with ease compared to a configuration in which the protrusion 732, which is separate from the extension portion 731, is coupled to the extension portion 731, for example. As will be understood from the above description, the high potential bus bar 70 includes the protrusion 732 protruding toward the circuit substrate 60 against the body 71. The extension portion 731 is an example of a "first extension portion" and the protrusion 732 is an example of a "first protrusion."

As shown in FIG. 6, the low potential bus bar 80 is a structure including a body 81, three connector portions 82 (82[1] to 82[3]), one connector portion 83, a coupler portion 84, and a coupler portion 85. The body 81, the respective connector portions 82, the connector portion 83, the coupler portion 84, and the coupler portion 85 are constructed as a single unit. For example, similar to the high potential bus bar 70, the low potential bus bar 80 is formed by bending a metal plate, which has a predetermined flat shape, by press working. The low potential bus bar 80 is located between the mounting substrate 41 and the circuit substrate 60.

The body 81 is a portion extending linearly in the direction of the X-axis. The coupler portion 84 is a portion bent or curved from the body 81 in plan view so as to couple an end of the body 81 extending in the X1 direction to the connection terminal N1. Similarly, the coupler portion 85 is a portion that is bent or curved from the body 81 in plan view so as to couple an end of the body 81 extending in the X2 direction to the connection terminal N2. In other words, a long portion, which is constituted by the coupler portion 84, the body 81, and the coupler portion 85, extends from the side wall 31 to the side wall 33 facing the side wall 31. One end of the portion is connected to the connection terminal N1, and the other end of the portion is connected to the connection terminal N2.

The body 71 and the body 81 extend in the direction of the X-axis in a position spaced apart from the reference plane R in the Y1 direction. In other words, as will be understood from FIG. 4 and FIG. 5, the body 71 and the body 81 overlap each mounting area 45H[k] in plan view, and the body 71 and the body 81 do not overlap each mounting area 45L[k] in plan view. In addition, the body 71 and the body 81 overlap each other in plan view. In other words, the body 71 and the body 81 face each other at a certain distance in the direction of the Z-axis. Specifically, the body 71 is located between the body 81 and the mounting substrate 41. In other words, the body 81 is in front of the body 71 in the Z2 direction. According to the above configuration, compared to a configuration in which the body 71 and the body 81 do not overlap in plan view, it is possible to reduce inductive components from current paths in the semiconductor apparatus 100. On the body 81 of the low potential bus bar 80, two spacers 58 are mounted. For example, the respective spacer 58 is mounted at each of positions at which the connector portion 73 is sandwiched in plan view in the direction of the X-axis. Each spacer 58 is a square tubular structure surrounding the body 71. A portion of the spacer 58 is interposed between the body 71 and the body 81; therefore, a space equivalent to the thickness of the spacer 58 is set between the body 71 and the body 81. An insulating sheet (not shown) may be interposed between the body 71 and the body 81. The insulating sheet is a layered or plate-shaped member with electrical insulation. For example, an insulating paper or an insulating resin film is suitable as an insulating sheet. Since the insulating sheet is interposed between the body 71 and the body 81, the electrical insulation between the body 71 and the body 81 is ensured.

Each connector portion 82 of the low potential bus bar 80 is a portion for electrically connecting the mounting substrate 41 (conductive patterns 44) to the body 81. Each connector portion 82 branches in the Y2 direction from the body 81. Specifically, each connector portion 82[*k*] branches in the Y2 direction from a portion of the body 81 corresponding to the mounting area 45L[k] in plan view, and each connector portion 82[*k*] is electrically connected to the conductive pattern 44L[k]_b in the mounting area 45L[k]. As will be understood from the above description, each connector portion 72 of the high potential bus bar 70 protrudes in the Y1 direction from the body 71, whereas each connector portion 82 of the low potential bus bar 80 protrudes in the Y2 direction from the body 81. In other words, in plan view, the direction in which each connector portion 72 protrudes from the body 71 is opposite to the direction in which each connector portion 82 protrudes from the body 81.

As shown in FIG. 7, the connector portion 82 includes an extension portion 55 and a terminal portion 56, similarly to the connector portion 72 described above. The extension portion 55 is a portion branching sideways from a side surface of the body 81, and the extension portion 55 extends in the direction parallel to the XY plane. The terminal portion 56 is a portion protruding in the Z1 direction from a tip of the extension portion 55 toward the mounting substrate 41. A tip of the terminal portion 56 is coupled to the conductive pattern 44 using, for example, a bonding material such as solder, etc. As will be understood from the above description, the connector portion 82[*k*] protrudes from the body 81 toward the mounting substrate 41, and the connector portion 82[*k*] is electrically connected to the drive circuit 11[*k*]. The body 81 is an example of a "second body" and the connector portion 82[*k*] is an example of a "second connector portion."

The connector portion 83 in FIG. 6 is a portion for electrically connecting the circuit substrate 60 to the body 81. The connector portion 83 branches from the body 81. Specifically, the connector portion 83 is a portion branching in the Y2 direction from a vicinity of a center of the body 81 in the direction of the X-axis.

As shown in FIG. 8, the connector portion 83 includes an extension portion 831 and a protrusion 832. The extension portion 831 is a portion branching from the body 81, and the extension portion 831 extends in the direction parallel to the XY plane. Specifically, the extension portion 831 is an L-shaped portion including a portion 831*a*, which extends in the Y2 direction from the body 81, and a portion 831*b* which extends in the X2 direction from a tip of the portion 831*a*. The protrusion 832 is a portion protruding in the Z2 direction from a tip of the extension portion 831 toward the circuit substrate 60. Specifically, the protrusion 832 is a portion bent from the extension portion 831. In other words, the protrusion 832 is formed by bending a portion, which branches sideways from the body 81, in the Z2 direction, by press working, for example. Therefore, similarly to the protrusion 732, a cross sectional shape of the protrusion 832 is rectangular. According to the above configuration, it is possible to form the protrusion 832 with ease compared to a configuration in which the protrusion 832, which is separate from the extension portion 831, is coupled to the extension portion 831, for example. As will be understood from the above description, the low potential bus bar 80 includes the protrusion 832 protruding toward the circuit substrate 60 against the body 81. The extension portion 831 is an example of a "second extension portion" and the protrusion 832 is an example of a "second protrusion."

As will be understood from FIG. 8, the protrusion 732 and the protrusion 832 are parallel to each other across a predetermined space in the direction of the Y-axis. Specifically, the protrusion 832 is spaced apart from the protrusion 732 in the Y2 direction. The central axis of the protrusion 732 and the central axis of the protrusion 832 are parallel to each other. The central axis of the protrusion 732 and the central axis of the protrusion 832 being "parallel" to each other includes, in addition to the central axes of both being strictly parallel to each other, the central axes of both being substantially parallel to each other. Therefore, for example, a state, in which the central axis of the protrusion 732 and the central axis of the protrusion 832 intersect each other within a range of a manufacturing error (−10 percent to +10 percent), may be interpreted as the central axes of both being substantially parallel to each other. The cross section of the protrusion 732 and the cross section of the protrusion 832 have the same shape. Similarly, the cross sections of both having the same shape includes, in addition to the cross sections of both being absolutely identical to each other in shape, the cross sections of both being substantially similar to each other in shape. Therefore, differences in shape within a range of manufacturing error may be interpreted as being substantially similar in shape.

As will be understood from FIG. 3, the body 71 and the body 81 are located between the mounting substrate 41 and the circuit substrate 60. The terminal portion 56 of the connector portion 72 protrudes in the Z1 direction from the body 71 toward the mounting substrate 41, whereas the protrusion 732 of the connector portion 73 protrudes in the Z2 direction from the body 71 toward the circuit substrate 60. In other words, the direction in which the terminal portion 56 protrudes from the body 71 is opposite to the direction in which the protrusion 732 protrudes from the body 71. Similarly, the terminal portion 56 of the connector portion 82 protrudes in the Z1 direction from the body 81 toward the mounting substrate 41, whereas the protrusion 832 of the connector portion 83 protrudes in the Z2 direction from the body 81 toward the circuit substrate 60. In other words, the direction in which the terminal portion 56 protrudes from the body 81 is opposite to the direction in which the protrusion 832 protrudes from the body 81.

As shown in FIG. 2 to FIG. 4, the three output terminals O[1] to O[3] are mounted on the side wall 32 of the housing 30. Specifically, in the X1 direction, the output terminal O[1] is in front of the output terminal O[2], and in the X2 direction, the output terminal O[3] is in front of the output terminal O[2]. As shown in FIG. 5 and FIG. 6, each output side bus bar 54[*k*] electrically connects the output terminal O[k] to the drive circuit 11[*k*]. Specifically, the output side bus bars 54[*k*] extends in the Y1 direction from the output terminal O[k] such that the output side bus bars 54[*k*] reaches the mounting area 45H[k] and the mounting area 45L[k] in plan view.

Specifically, the output side bus bar 54[*k*] includes a body 541[*k*], a connector portion 542[*k*], and a connector portion 543[*k*], as shown in FIG. 6. The body 541[*k*] is a portion extending linearly in the Y1 direction from the output terminal O[k]. Specifically, the body 541[*k*] extends in the Y1 direction from the output terminal O[k] to cross the reference plane R. In other words, a tip of the body 541[*k*] protrudes in the Y1 direction from the reference plane R. To avoid overlapping the output side bus bar 54[*k*] in plan view, the body 71 and the body 81 are spaced apart from the reference plane R in the Y1 direction.

The connector portion 542[*k*] branches in the direction of the X-axis from an end of the body 541[*k*] corresponding to the mounting area 45H[k], and the connector portion 542[*k*] is electrically connected to the conductive pattern 44H[k]_b in the mounting area 45H[k]. In addition, the connector portion 543[*k*] branches in the direction of the X-axis from a portion of the body 541[*k*] corresponding to the mounting area 45L[k], and the connector portion 543[*k*] is electrically connected to the conductive pattern 44L[k]_a in the mounting area 45L[k]. The specific structures of the connector portion 542[*k*] and the connector portion 543[*k*] and their coupling to the conductive pattern 44 are similar to those of the connector portion 72 or those of the connector portion 82 shown in FIG. 7.

As will be understood from the above description, the drive circuit 11[*k*] is formed by electrically connecting elements in the mounting area 45H[k] to elements in the mounting area 45L[k] through the output side bus bar 54[*k*]. The high potential bus bar 70 and the low potential bus bar 80 are, as described above with reference to FIG. 1, electrically connected to each drive circuit 11[*k*]. As will be understood from the above description, the body 71 of the high potential bus bar 70 includes a path electrically connecting each connection terminal P (P1, P2) to each drive circuit 11[*k*]. Similarly, the body 81 of the low potential bus bar 80 includes a path electrically connecting each connection terminal N (N1, N2) to each drive circuit 11[*k*].

The circuit substrate 60 in FIG. 2 is a rigid printed circuit substrate with a substrate surface on which a plurality of wiring patterns is formed. The circuit substrate 60 is a board-shaped member including a first surface F1 and a second surface F2, as shown in FIG. 3. The first surface F1 and the second surface F2 are substrate surfaces opposite to each other. The circuit substrate 60 is fixed to the housing 30 with the first surface F1 facing each drive circuit 11[*k*](or mounting substrate 41). In other words, the first surface F1 faces in the Z1 direction and the second surface F2 faces in the Z2 direction. The first surface F1 and the second surface F2 are each a plane parallel to the XY plane. Therefore, the direction of the X-axis (X1, X2) and the direction of the Y-axis (Y1, Y2) may be each referred to as a direction parallel to the first surface F1 or the second surface F2. The direction of the Z-axis is a direction of the substrate thickness of the circuit substrate 60. The reference plane R may be referred to as a plane dividing the circuit substrate 60 in half in the direction of the Y-axis.

As shown in FIG. 3, the circuit substrate 60 is fixed to the housing 30 with the first surface F1 in contact with an upper surface of each of the supports 37 (37H[1] to 37H[3], 37L[1] to 37L[3]). As shown in FIG. 2, the circuit substrate 60 has a plurality of through holes Ha and a plurality of through holes Hb. The through holes Ha are aligned linearly along an outer peripheral edge of the circuit substrate 60. The through holes Ha are formed in a position overlapping each support 37 in plan view.

As shown in FIG. 3, in a state in which the circuit substrate 60 is housed in the housing 30, the upper end 382 of each control terminal 38 protrudes in the Z2 direction from the second surface F2 by being inserted through the through hole Ha. The upper end 382 of each control terminal 38 is electrically connected to the wiring patterns on the second surface F2 with, for example, a bonding material such as solder, etc. In addition, in a state in which the circuit substrate 60 is housed in the housing 30, the lower end 391 of each control terminal 39 protrudes in the Z2 direction from the second surface F2 by being inserted through the through hole Hb. The lower end 391 of each external terminal 39 is electrically connected to the wiring patterns on the second surface F2 with, for example, a bonding material such as solder, etc.

As shown in FIG. 2, the circuit substrate 60 includes a first portion 61, a second portion 62, a coupling portion 63, a coupling portion 64, and a coupling portion 65. Each of the first portion 61 and the second portion 62 is an elongated portion in the direction of the X-axis. The first portion 61 and the second portion 62 are spaced apart from each other in the direction of the Y-axis. Each coupling portion (63, 64, 65) is a portion coupling the first portion 61 to the second portion 62. The coupling portion 63 couples an end of the first portion 61 extending in the X1 direction to an end of the second portion 62 extending in the X1 direction. The coupling portion 64 couples an end of the first portion 61 extending in the X2 direction to an end of the second portion 62 extending in the X2 direction. In addition, the coupling portion 65 couples a central portion of the first portion 61 in the direction of the X-axis to a central portion of the second portion 62 in the direction of the X-axis. The coupling portion 65 is located roughly at a center of the circuit substrate 60 in plan view. Specifically, the coupling portion 65 intersects the reference plane R at the center of the circuit substrate 60 in the direction of the X-axis. For example, the coupling portion 65 is a portion in which a center of gravity in an outer shape of the circuit substrate 60 (i.e., a figure defined by the outer peripheral edge) is present.

As will be understood from the above description, an opening 66 and an opening 67 are formed in the circuit substrate 60. The opening 66 and the opening 67 are each a through hole formed between the first portion 61 and the second portion 62. Specifically, the opening 66 is a space surrounded by the first portion 61, the coupling portion 63, the second portion 62, and the coupling portion 65 in plan view. The opening 67 is a space surrounded by the first portion 61, the coupling portion 65, the second portion 62, and the coupling portion 64 in plan view. Accordingly, the coupling portion 65 is located between the opening 66 and the opening 67 in plan view. In other words, in the circuit substrate 60, an elongated space in the X-axis is divided by the coupling portion 65 into the opening 66 and the opening 67. The opening 66 is an example of a "first opening" and the opening 67 is an example of a "second opening."

The encapsulating material (not shown) is supplied to a space inside the housing 30 via the opening 66 or the opening 67. The encapsulating material is an insulating mold for encapsulating the drive circuit 11[*k*]. For example, a resin material such as an epoxy resin is used as the encapsulating material. As will be understood from the above description, the opening 66 and the opening 67 are used as supply ports for the encapsulating material. In addition, the coupling portion 65 is formed between the opening 66 and the opening 67; therefore, there is an advantage of being easy to maintain mechanical strength of the circuit substrate 60 compared to a configuration in which the coupling portion 65 is omitted.

As shown in FIG. 2, the control circuit 13 and the capacitive element 15 shown in FIG. 1 are mounted on the circuit substrate 60. Specifically, the control circuit 13 and the capacitive element 15 are mounted on the second surface F2 of the circuit substrate 60. As mentioned above, the control circuit 13 includes the six control chips 14 (14H[1] to 14H[3], 14L[1] to 14L[3]) corresponding to the respective switching elements S. The six control chips 14 of the control circuit 13 are mounted on the second surface F2. Three control chips 14H[1] to 14H[3] corresponding to the switching element SH[k] on the high potential side are mounted on the first portion 61 of the circuit substrate 60. Specifically, the three control chips 14H[1] to 14H[3] are aligned on the second surface F2 of the first portion 61 with the three control chips 14H[1] to 14H[3] spaced apart from each other in the direction of the X-axis. In other words, the three control chips 14H[1] to 14H[3] are aligned along an outer peripheral edge of the circuit substrate 60, which extends in the direction of the X-axis, on the first portion 61. In addition, the three control chips 14L[1] to 14L[3] corresponding to the switching element SL[k] on the low potential side are mounted on the second portion 62 of the circuit substrate 60. Specifically, the three control chips 14L[1] to 14L[3] are aligned on the second surface F2 of the second portion 62 with the three control chips 14L[1] to 14L[3] spaced apart from each other in the direction of the X-axis. In other words, the three control chips 14L[1] to 14L[3] are aligned along an outer peripheral edge of the circuit substrate 60, which extends in the direction of the X-axis, on the second portion 62.

The capacitive element 15 is a passive element mounted on the circuit substrate 60. Specifically, the capacitive element 15 is a chip capacitor including a first electrode 151 and a second electrode 152. As shown in FIG. 2 and FIG. 3, the capacitive element 15 is mounted on the coupling portion 65 of the circuit substrate 60. Therefore, the capacitive element 15 is located at the center of the circuit substrate 60. Specifically, the capacitive element 15 intersects the reference plane R at the center of the circuit substrate 60 in the direction of the X-axis.

As described above, in the first embodiment, the capacitive element 15 is mounted on the coupling portion 65 coupling the first portion 61 and the second portion 62 of the circuit substrate 60. In other words, the portion of the circuit substrate 60, which couples the first portion 61 to the second portion 62, can be effectively used for the arrangement of the capacitive element 15.

As mentioned above, the three control chips 14H[1] to 14H[3] of the control circuit 13 are mounted on the first portion 61, whereas the three control chips 14L[1] to 14L[3] of the control circuit 13 are mounted on the second portion 62. In other words, the plurality of control chips 14 is arranged in an area surrounding the capacitive element 15. In other words, the plurality of control chips 14 is arranged to surround the capacitive element 15 in plan view. Specifically, the capacitive element 15 is arranged between an array of three control chips 14H[1] to 14H[3] and an array of three control chips 14L[1] to 14L[3].

As mentioned above, in the first embodiment, the body 71 of the high potential bus bar 70 and the body 81 of the low potential bus bar 80 are spaced apart from the reference plane R in the Y1 direction. On the other hand, the capacitive element 15 is located on the reference plane R. Therefore, as will be understood from FIG. 2, the capacitive element 15 overlaps neither the body 71 nor the body 81 in plan view. In addition, in the first embodiment, each control chip 14 overlaps neither the body 71 nor the body 81 in plan view, as well.

Heat generated due to an operation of each drive circuit 11[*k*] may spread to the high potential bus bar 70 or the low potential bus bar 80. In a configuration in which the capacitive element 15 overlaps the body 71 or the body 81 in plan view, the capacitive element 15 may be heated due to the heat of the high potential bus bar 70 or due to the heat of the low potential bus bar 80. In the first embodiment, the capacitive element 15 overlaps neither the body 71 nor the body 81 in plan view; therefore, the heat of the high potential bus bar 70 or the heat of the low potential bus bar 80 has difficulty reaching the capacitive element 15. Therefore, change in the electrical characteristics of the capacitive element 15 due to heating are reduced. Consequently, malfunctions of the semiconductor apparatus 100 due to the change in the electrical characteristics of the capacitive element 15 are reduced. In addition, in the first embodiment, each control chip 14 overlaps neither the body 71 nor the body 81 in plan view, as well. Therefore, regarding each control chip 14, malfunctions due to heating are reduced, as well. In a case in which the spread of heat to the capacitive element 15 or to each control chip 14 is not a particular problem, a configuration is assumed in which the capacitive element 15 or each control chip 14 overlaps the body 71 or the body 81 in plan view.

In addition, a configuration (hereinafter referred to as a "comparative example") is assumed in which the capacitive element 15 is mounted on the mounting substrate 41. However, in the comparative example, it is necessary to prepare an area for mounting the capacitive element 15 in addition to the plurality of mounting areas 45 corresponding to the respective switching elements S. Therefore, the mounting substrate 41 needs to be enlarged, and as a result, there is a problem in that the reduction in size of the semiconductor apparatus 100 is limited. In contrast to the comparative example described above, according to the first embodiment, the capacitive element 15 is mounted on the circuit substrate 60; therefore, the mounting substrate 41 need not to be made larger. Therefore, there is an advantage in that the semiconductor apparatus 100 can be reduced in size easily compared to the comparative example.

Soldering is used to mount each switching element S on the mounting substrate 41. From the viewpoint of ensuring the reliability of the mechanical and electrical connection between the mounting substrate 41 and each switching element S, it is necessary to use solder with a high melting point. In a case in which, in the comparative example, in addition to the switching element S, the capacitive element 15 is soldered to the mounting substrate 41 in a similar process, solder with a high melting point is used to couple the capacitive element 15 because of the circumstances described above. In other words, the capacitive element 15 may be heated to a high temperature in the soldering process. Therefore, the capacitive element 15 may be damaged due to heating, or the electrical characteristics of the capacitive element 15 may be changed by heating from the target characteristics. In contrast to the comparative example, in the first embodiment, the capacitive element 15 is mounted on the circuit substrate 60. Solder with a low melting point is used in soldering to mount various electrical components, which includes the capacitive element 15, on the circuit substrate 60. Therefore, even when solder with a high melting point is used to mount the switching element S on the mounting substrate 41, solder with a low melting point can be used to mount the capacitive element 15 on the circuit substrate 60. In other words, it is possible to avoid the capacitive element 15 being heated to an excessively high temperature. Therefore, according to the first embodiment, the probability of the capacitive element 15 being damaged due to heating in the manufacturing process of the semiconductor apparatus 100, or the probability of the electrical characteristics of the capacitive element 15 being changed, is reduced.

Figure 9:
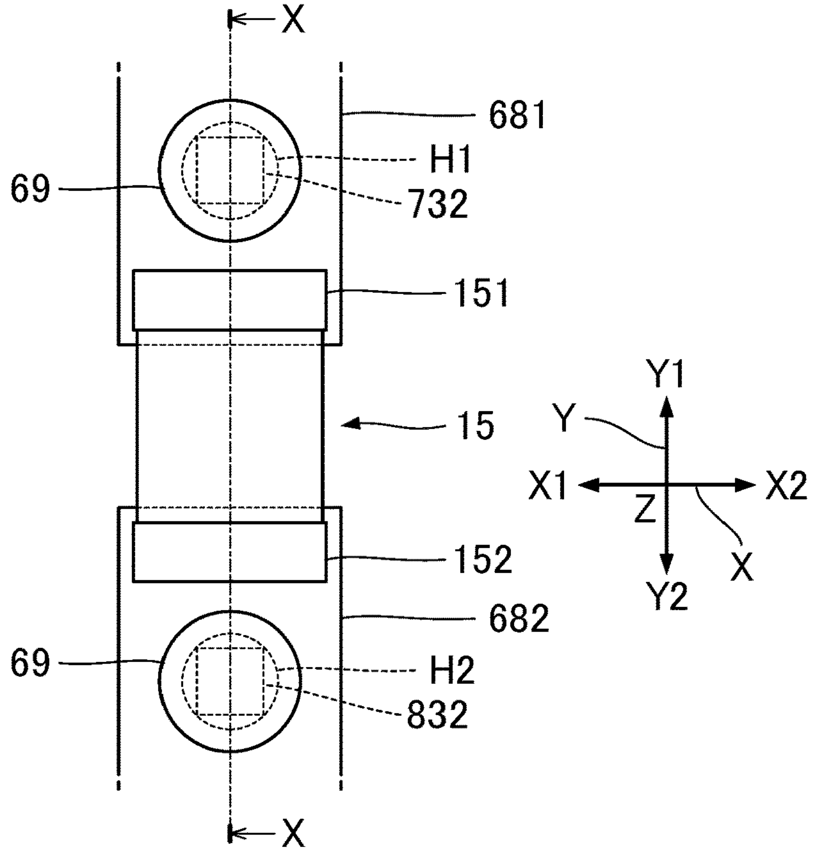
FIG. 9 is an enlarged plan view showing a vicinity of a capacitive element.
Figure 10:
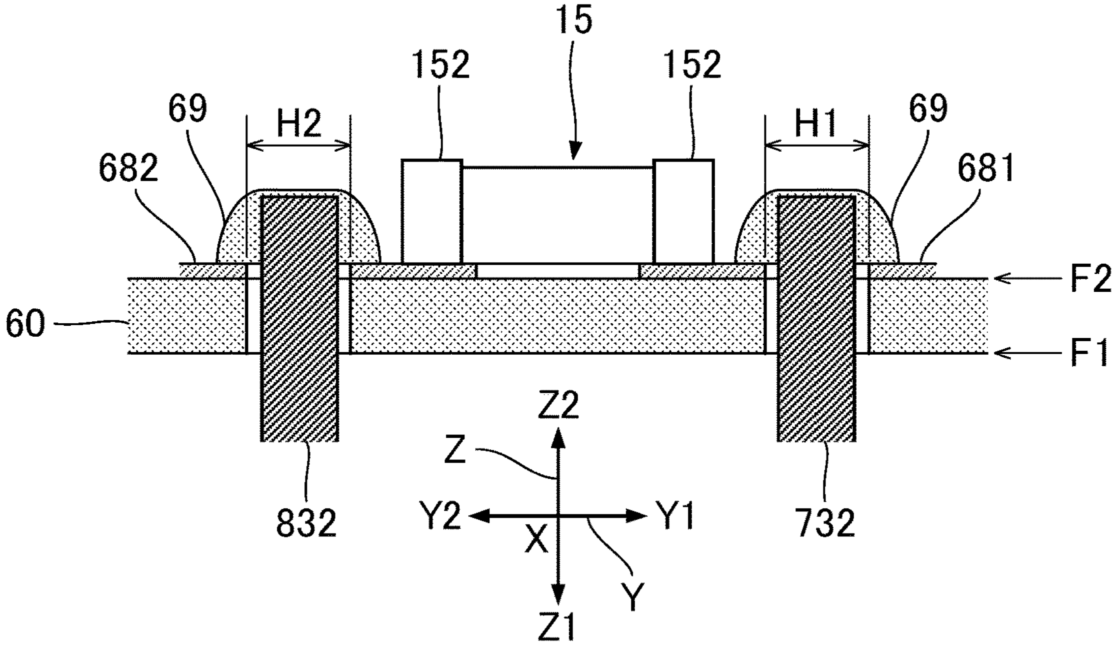
FIG. 10 is a cross section taken along line X-X in FIG. 9.

FIG. 9 is an enlarged plan view showing a vicinity of the capacitive element 15. FIG. 10 is a cross section taken along line X-X in FIG. 9. As shown in FIG. 9 and FIG. 10, on the second surface F2 of the circuit substrate 60, a wiring pattern 681 and a wiring pattern 682 are formed. The first electrode 151 of the capacitive element 15 is electrically connected to the wiring pattern 681 by, for example, a bonding material such as solder, etc. In addition, the second electrode 152 is electrically connected to the wiring pattern 682 by a similar bonding material.

Through hole H1 and through hole H2 are formed in the circuit substrate 60. Each of the through hole H1 and the through hole H2 is a circular opening penetrating the circuit substrate 60. The through hole H1 and the through hole H2 are formed in the coupling portion 65 of the circuit substrate 60. The through hole H1 overlaps the wiring pattern 681 in plan view, and the through hole H2 overlaps the wiring pattern 682 in plan view. The diameter of each of the through hole H1 and the through hole H2 is greater than or equal to the maximum length of the diagonal in the cross section of each of the protrusion 732 and the protrusion 832 described above.

As will be understood from FIG. 9 and FIG. 10, in a case in which the circuit substrate 60 is fixed to the housing 30, the protrusion 732 of the high potential bus bar 70 is inserted through the through hole H1. Similarly, the protrusion 832 of the low potential bus bar 80 is inserted through the through hole H2. The tip of each of the protrusion 732 and the protrusion 832 protrudes in the Z2 direction from the second surface F2 of the circuit substrate 60. The tip of each of the protrusion 732 and the protrusion 832 is coupled to the circuit substrate 60 by, for example, a bonding material 69 such as solder, etc. Specifically, the tip of the protrusion 732 is electrically connected to the wiring pattern 681 with the tip of the protrusion 732 coupled to the second surface F2 of the circuit substrate 60. Similarly, the tip of the protrusion 832 is electrically connected to the wiring pattern 682 with the tip of the protrusion 832 coupled to the second surface F2 of the circuit substrate 60.

As will be understood from the above description, the capacitive element 15 is electrically connected to the protrusion 732 and the protrusion 832. Specifically, the first electrode 151 of the capacitive element 15 is electrically connected to the protrusion 732 via the wiring pattern 681. In addition, the second electrode 152 of the capacitive element 15 is electrically connected to the protrusion 832 via the wiring pattern 682.

Method of Manufacturing Semiconductor Apparatus 100

Figure 11:
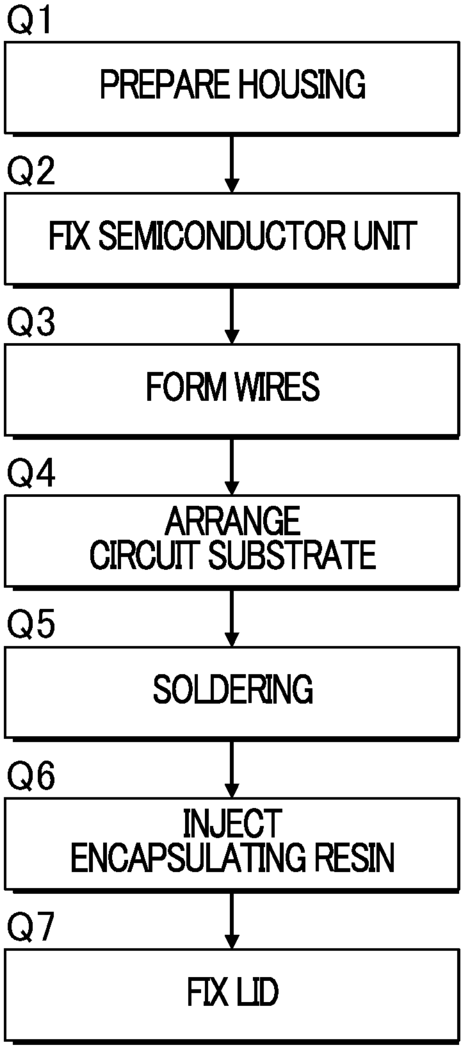
FIG. 11 is a diagram showing a process of manufacturing the semiconductor apparatus.

FIG. 11 is a diagram showing a process of manufacturing the semiconductor apparatus 100. First, the housing 30 is prepared in step Q1. Each connection terminal P, each connection terminal N, each output terminal O[k], each control terminal 38, each external terminal 39, and the connecting conductor 50 are integrally formed together with the housing 30, for example, by insert molding.

In step Q2 after execution of step Q1, the base 21 and the semiconductor unit 40 are fixed to the housing 30. For example, the base 21, which has an upper surface coupled to the semiconductor unit 40, is coupled to the housing 30. In step Q3 after execution of step Q2, a plurality of wires is formed. For example, wires are formed which electrically connect the respective control terminals 38 to the respective control electrodes G of the respective switching elements S.

In step Q4 after execution of step Q3, the circuit substrate 60 is arranged in the space inside the housing 30. Specifically, the circuit substrate 60 is lowered in the Z1 direction until the first surface F1 of the circuit substrate 60 is in contact with the upper surface of each of the supports 37 of the housing 30. In the process of lowering the circuit substrate 60, the protrusion 732 is inserted through the through hole H1, the protrusion 832 is inserted through the through hole H2, the upper end 382 of each control terminal 38 is inserted through the respective through hole Ha, and the lower end 391 of each external terminal 39 is inserted through the respective through hole Hb.

In step Q5 after execution of step Q4, the protrusion 732, the protrusion 832, each control terminal 38, and each external terminal 39 are soldered to the second surface F2 of the circuit substrate 60. In step Q5, the circuit substrate 60 is fixed to the housing 30. In step Q6 after execution of step Q5, the encapsulating material is supplied to the space inside the housing 30 through the opening 66 and the opening 67 of the circuit substrate 60. In step Q7 after curing of the encapsulating material, the lid 22 is fixed to the housing 30 to complete the semiconductor apparatus 100.

As described above, in the first embodiment, the protrusion 732 included in the high potential bus bar 70 and the protrusion 832 included in the low potential bus bar 80 are electrically connected to the capacitive element 15 on the circuit substrate 60. Therefore, independent elements, which electrically connect each of the connection terminals P and the connection terminals N to the capacitive element 15, are not necessary. Therefore, for example, compared to a configuration in which the connection terminals P and the connection terminals N are electrically connected to the capacitive element 15 by dedicated wirings, the number of parts is reduced, and as a result, the manufacture of the semiconductor apparatus 100 is simplified. For example, as described above with reference to FIG. 11, in the process (step Q4) of arranging the circuit substrate 60 in the housing 30, the protrusion 732 is inserted through the through hole H1 and the protrusion 832 is inserted through the through hole H2. Therefore, an independent process of installing elements for connecting each of the connection terminals P and the connection terminals N to the capacitive element 15 is not necessary, and consequently, it is possible to fix the protrusion 732 and the protrusion 832 to the circuit substrate 60 easily.

In the first embodiment, the body 71 of the high potential bus bar 70 and the body 81 of the low potential bus bar 80 are located between the mounting substrate 41 and the circuit substrate 60. In other words, the mounting substrate 41, the body 71, the body 81, and the circuit substrate 60 are stacked in the direction of the Z-axis. Therefore, compared to a configuration in which the body 71 and the body 81 do not overlap with the mounting substrate 41 or the circuit substrate 60 in plan view, it is possible to reduce the planar size of the semiconductor apparatus 100.

In the first embodiment, the multiple control chips 14 are arranged around the capacitive element 15 along the periphery of the circuit substrate 60. According to the configuration described above, it is possible to reduce respective differences between respective distances (electrical path length) between the respective control chips 14 and the capacitive element 15 (ideally, it is possible to match the respective distances). Therefore, compared to a configuration in which the capacitive element 15 is located near the periphery of the circuit substrate 60, it is possible to efficiently realize effects of using the capacitive element 15 (for example, the change in the frequency characteristics of noise described above).

B: Second Embodiment

Figure 12:
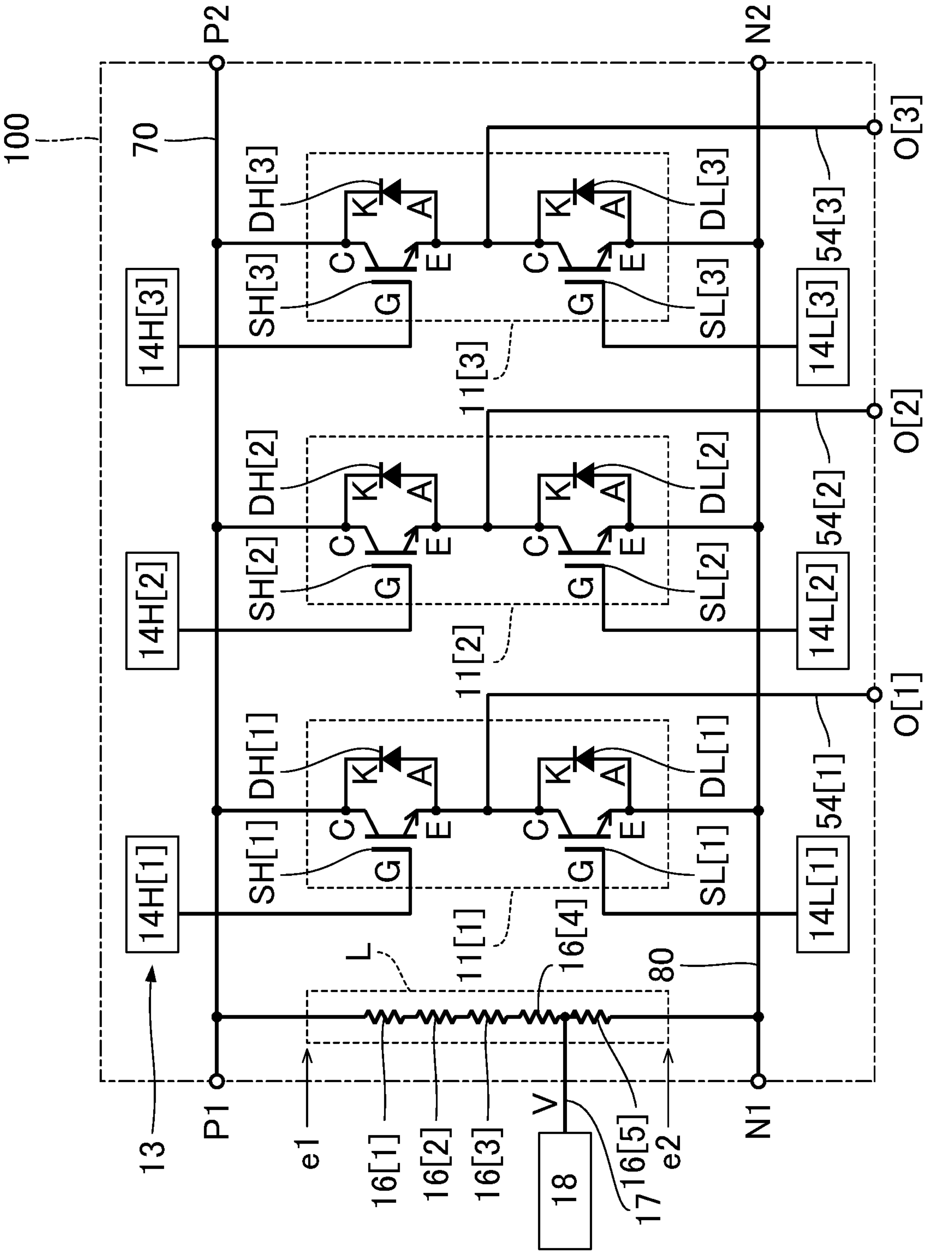
FIG. 12 is a circuit diagram showing an electrical configuration of the semiconductor apparatus according to a second embodiment.

FIG. 12 is a circuit diagram showing the electrical configuration of the semiconductor apparatus 100 according to the second embodiment. As shown in FIG. 12, the second embodiment is an embodiment in which the capacitive element 15 in the first embodiment is replaced by a series of resistors L. Other components of the semiconductor apparatus 100 are the same as in the first embodiment.

The series of resistors L (ladder resistor) is a passive element in which five resistive elements 16 (16[1] to 16[5]) are connected to each other in series. The series of resistors L includes a first end e1 and a second end e2. The first end e1 and the second end e2 are ends opposite to each other. Specifically, the first end e1 is one terminal of two terminals of the resistive element 16[1], the one terminal being opposite to the other terminal connected to the resistive element 16[2]. The second end e2 is one terminal of two terminals of the resistive element 16[5], the one terminal being opposite to the other terminal connected to the resistive element 16[4]. The first end e1 is electrically connected to the high potential bus bar 70. The second end e2 is electrically connected to the low potential bus bar 80.

A detection line 17 is electrically connected between the resistive element 16[4] and the resistive element 16[5] adjacent to each other in the series of resistors L. Therefore, a voltage (hereinafter referred to as a "detection voltage") V, which is obtained by dividing a voltage between the connection terminal P and the connection terminal N by the series of resistors L, is output to the detection line 17. The resistive element 16[4] is an example of a "first resistive element" and the resistive element 16[5] is an example of a "second resistive element." The number of resistive elements 16 in the series of resistors L may be changed as needed. The position of the detection line 17 relative to the series of resistors L may be selected as needed.

As shown in FIG. 12, a detection circuit 18 is electrically connected to the detection line 17. The detection circuit 18 is a circuit for detecting an unusual state of the detection voltage V supplied via the detection line 17. The detection circuit 18 may be mounted on any of the control chips 14, alternatively the detection circuit 18 may be mounted on the circuit substrate 60, separately from the control chips 14. The detection circuit 18 may be configured separately from the semiconductor apparatus 100 to be externally attached to the semiconductor apparatus 100.

Figure 13:
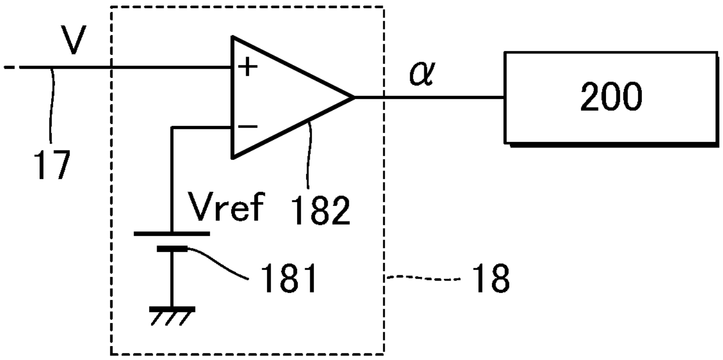
FIG. 13 is a block diagram showing a configuration of a detection circuit.

FIG. 13 is a block diagram showing a configuration of the detection circuit 18. As shown in FIG. 13, the detection circuit 18 includes a reference voltage source 181 and a comparison circuit 182. The reference voltage source 181 is a power supply configured to generate a predetermined voltage (hereinafter referred to as a "reference voltage") Vref that serves as a reference for the detection voltage V. The reference voltage Vref is set to an upper limit of a range of specifications in which fluctuations are allowed for the detection voltage V. The comparison circuit 182 compares the detection voltage V with the reference voltage Vref. Specifically, the comparison circuit 182 outputs a warning signal a based on the detection voltage V being greater than the reference voltage Vref. In other words, the warning signal a is output from the detection circuit 18 based on the detection voltage V rising to a voltage greater than the upper limit of the allowable range. On the other hand, when the detection voltage V is equal to the reference voltage Vref or when the detection voltage V is less than the reference voltage Vref, the warning signal a is not output.

An external control apparatus 200 is connected to an output terminal of the detection circuit 18. The control apparatus 200 is externally connected to the semiconductor apparatus 100 to control the semiconductor apparatus 100. The control apparatus 200 detects an unusual state of the semiconductor apparatus 100 in response to receiving the warning signal a from the detection circuit 18, and the control apparatus 200 is capable of stopping the operation of the semiconductor apparatus 100 based on the detection of the unusual state.

As described above, in the second embodiment, the detection voltage V, which is obtained by dividing the voltage between the connection terminal P and the connection terminal N by the plurality of resistive elements 16[1] to 16[5], is detected by the detection line 17. Therefore, it is possible to detect the unusual state of the voltage between the connection terminal P and the connection terminal N.

Figure 14:
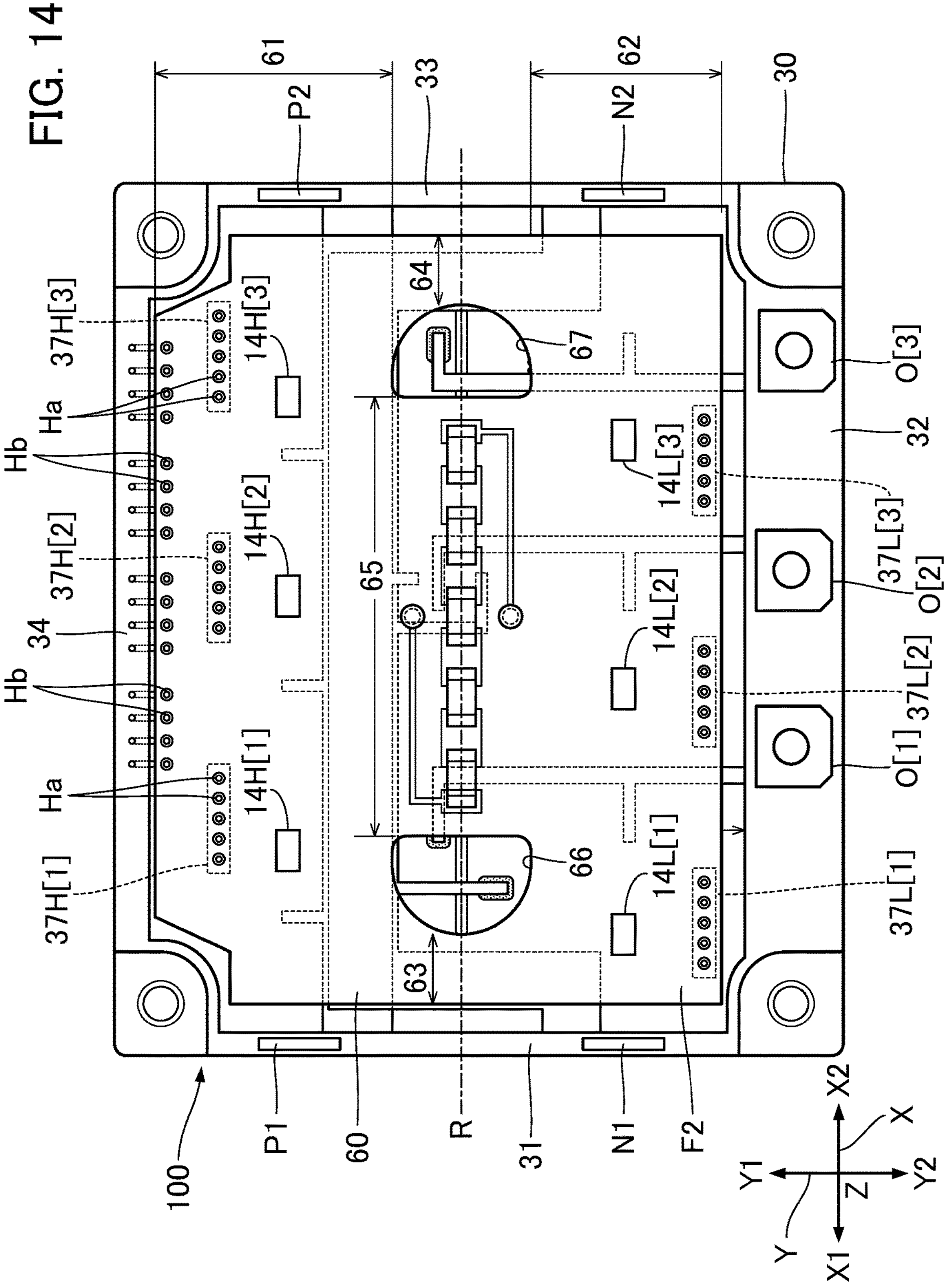
FIG. 14 is a plan view showing a configuration of the semiconductor apparatus according to the second embodiment.
Figure 15:
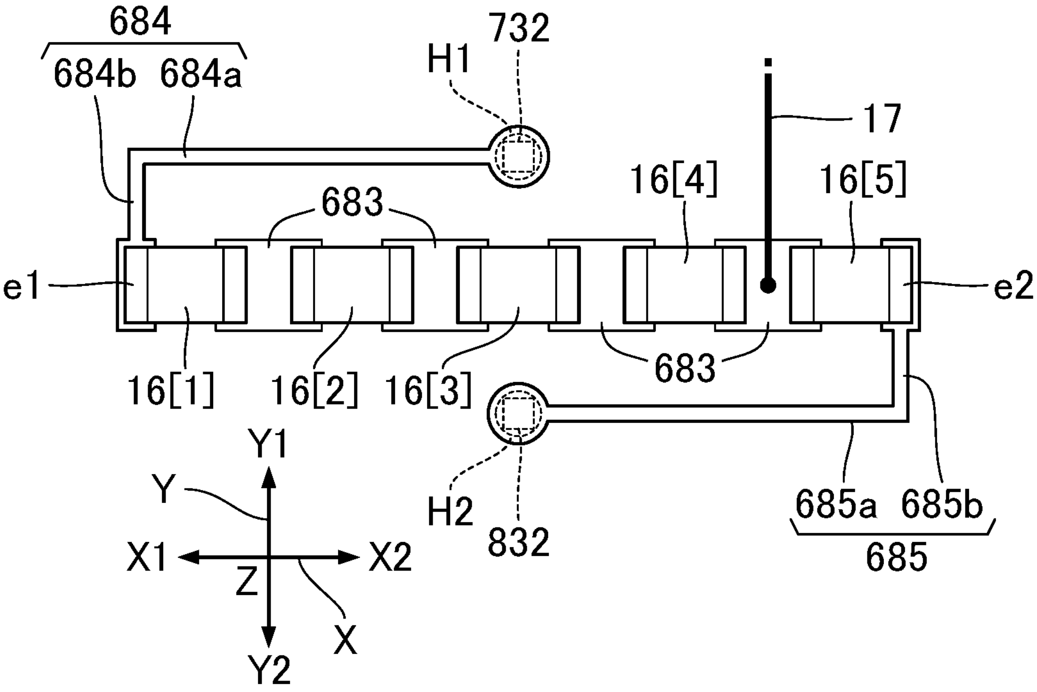
FIG. 15 is an enlarged plan view showing a series of resistors according to the second embodiment.

FIG. 14 is a plan view showing a configuration of the semiconductor apparatus 100 according to the second embodiment. In addition, FIG. 15 is an enlarged plan view showing the series of resistors L. As in the first embodiment, the through hole H1 and the through hole H2 are formed in the coupling portion 65 of the circuit substrate 60. The through hole H1 and the through holes H2 are spaced apart from each other in the direction of the Y-axis. The protrusion 732 of the high potential bus bar 70 is inserted through the through hole H1, and the protrusion 832 of the low potential bus bar 80 is inserted through the through hole H2.

Each of the five resistive elements 16[1] to 16[5] constituting the series of resistors L is a chip resistor mounted on the second surface F2 of the circuit substrate 60. Each resistive element 16 is mounted on the coupling portion 65 of the circuit substrate 60. Specifically, the five resistive elements 16[1] to 16[5] are aligned linearly in the direction of the X-axis in an area between the through hole H1 and the through hole H2. In other words, a direction (Y-axis), in which the through hole H1 and the through hole H2 are aligned, and a direction (X-axis), in which the resistive elements 16 are aligned, are perpendicular to each other. In the direction of the X-axis, the through hole H1 and the through hole H2 are located roughly in a center of the series of resistors L (specifically, a midpoint between the first end e1 and the second end e2). In addition, as will be understood from FIG. 14, the five resistive elements 16[1] to 16[5] are aligned linearly between the opening 66 and the opening 67. Two resistive elements 16 adjacent to each other are electrically connected to each other by a wiring pattern 683 on the second surface F2.

On the second surface F2 of the circuit substrate 60, a wiring pattern 684 and a wiring pattern 685 are formed. The through hole H1 overlaps the wiring pattern 684 in plan view, and the through hole H2 overlaps the wiring pattern 685 in plan view. The protrusion 732 inserted through the through hole H1 is electrically connected to the wiring pattern 684 by, for example, a bonding material such as solder, etc. The protrusion 832 inserted through the through hole H2 is electrically connected to the wiring pattern 685 by, for example, a bonding material such as solder, etc.

The wiring pattern 684 is an L-shaped conductive pattern including a wiring portion **684*a* and a wiring portion 684*b*. The wiring portion 684*a* is a portion extending linearly in the X1 direction from the through hole H1. The wiring portion 684*b* is a portion extending in the Y2 direction from an end of the wiring portion 684*a* extending in the X1 direction to the first end e1. The first end e1 of the series of resistors L is electrically connected to the wiring portion 684*b*. In other words, the first end e1 is electrically connected to the protrusion 732 of the high potential bus bar 70, as shown in FIG. 12**.

On the other hand, the wiring pattern 685 is an L-shaped conductive pattern including a wiring portion **685*a* and a wiring portion 685*b*. The wiring portion 685*a* is a portion extending linearly in the X2 direction from the through hole H2. The wiring portion 685*b* is a portion extending in the Y1** direction from an end of the wiring portion 685*a* extending in the X2 direction to the second end e2. The second end e2 of the series of resistors L is electrically connected to the wiring portion 685*b*. In other words, the second end e2 is electrically connected to the protrusion 832 of the low potential bus bar 80, as shown in FIG. 12. As will be understood from the above description, the series of resistors L and the wiring patterns (683 to 685) according to the second embodiment are arranged with a relationship of point symmetry, etc., with respect to the center or the center of gravity of the circuit substrate 60.

The detection line 17 includes a wire electrically connected between the resistive element 16[4] and the resistive element 16[5]. A wiring pattern formed on the second surface F2 of the circuit substrate 60 may be used as the detection line 17.

From among components of the semiconductor apparatus 100, components different from components related to the series of resistors L are the same as in the first embodiment. For example, the configuration described for the capacitive element 15 in the first embodiment is applicable to the series of resistors L in the second embodiment, as well. For example, the series of resistors L is located at the center of the circuit substrate 60, and the multiple control chips 14 are arranged around the series of resistors L. The series of resistors L overlaps neither the body 71 nor the body 81 in plan view.

As described above, in the second embodiment, the protrusion 732 included in the high potential bus bar 70 and the protrusion 832 included in the low potential bus bar 80 are electrically connected to the series of resistors L on the circuit substrate 60. Therefore, independent elements for electrically connecting each of the connection terminals P and the connection terminals N to the series of resistors L are not necessary. Therefore, as in the first embodiment, compared to a configuration in which, for example, the connection terminals P and the connection terminals N are electrically connected to the series of resistors L by dedicated wirings, the manufacture of the semiconductor apparatus 100 is simplified. As described above, according to the second embodiment, the same effects as those of the first embodiment are realized.

C: Modifications

Specific modifications added to each of the aspects described above are described below. Two or more modes selected from the following descriptions may be combined with one another as appropriate as long as such combination does not give rise to any conflicts. The following description will comprehensively describe each of the capacitive element 15 shown in the first embodiment and the series of resistors L shown in the second embodiment as a "passive element."

Figure 16:
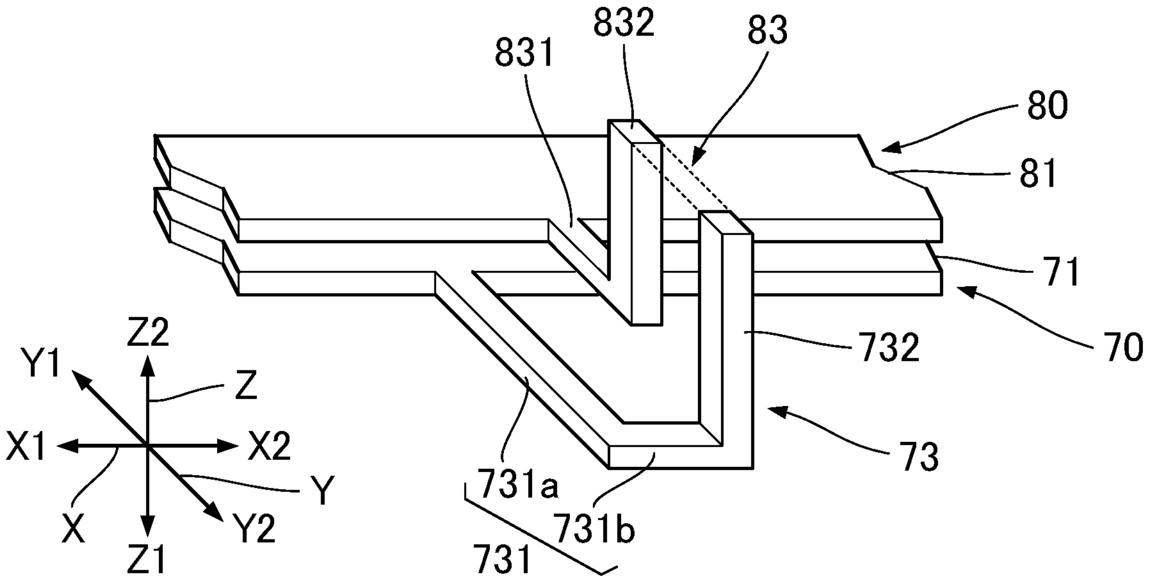
FIG. 16 is a perspective view showing the high potential bus bar and the low potential bus bar according to a modification (1).

(1) The structure of the connector portion 73 of the high potential bus bar 70 and the structure of the connector portion 83 of the low potential bus bar 80 are not limited to the examples in each embodiment described above. For example, in each embodiment described above, as shown in FIG. 8, the connector portion 73 of the high potential bus bar 70 includes the linear extension portion 731; however, as shown in FIG. 16, an L-shaped extension portion 731 including both a portion 731*a* and a portion 731*b* may be formed in the high potential bus bar 70. The portion 731*a* extends in the Y2 direction from the body 71 of the high potential bus bar 70. The portion 731*b* extends in the X2 direction from the tip of the portion 731*a*. In each embodiment described above, as shown in FIG. 8, the configuration is described in which the connector portion 83 of the low potential bus bar 80 includes the L-shaped extension portion 831; however, as shown in FIG. 16, the extension portion 831 may be a portion extending linearly in the Y2 direction from the body 81.

Figure 17:
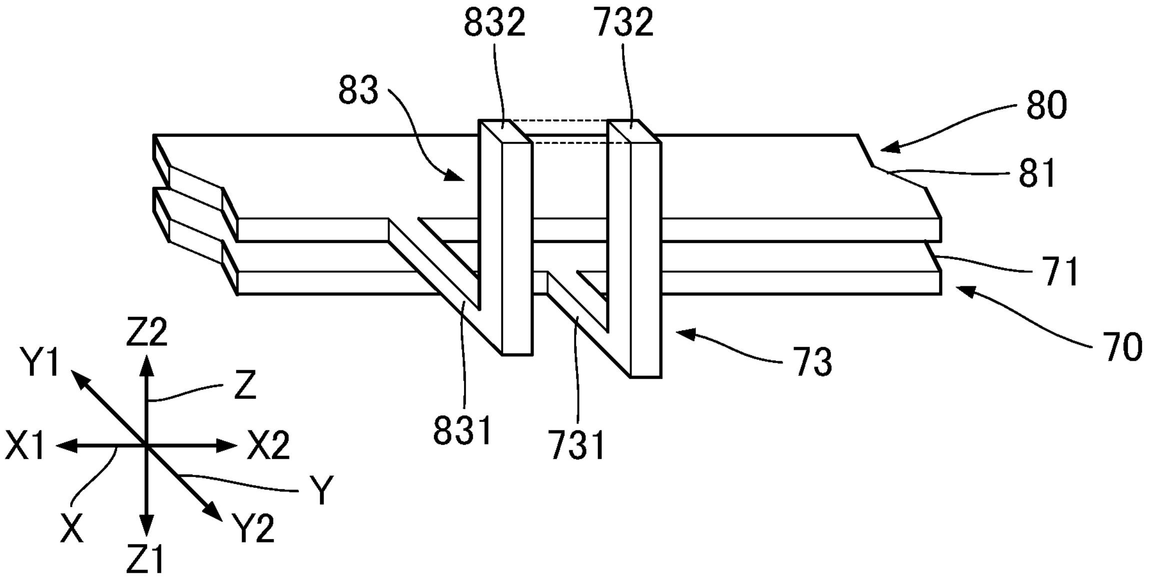
FIG. 17 is a perspective view showing the high potential bus bar and the low potential bus bar according to a modification (2).

(2) In each embodiment described above, the configuration is described in which the protrusion 732 and the protrusion 832 are aligned in the Y-axis direction; however, a positional relationship between the protrusion 732 and the protrusion 832 is not limited to the example described above. For example, as shown in FIG. 17, a configuration may be assumed in which the protrusion 732 and the protrusion 832 are aligned apart from each other in the direction of the X-axis. The connector portion 73 in FIG. 17 is the same as in the first embodiment. On the other hand, the connector portion 83 is formed in the same shape as that of the connector portion 73. In other words, the extension portion 831 of the connector portion 83 shown in FIG. 17 extends linearly in the Y2 direction from the body 81. Accordingly, the protrusion 732 and the protrusion 832 are aligned apart from each other in the direction of the X-axis. In the configuration of FIG. 17, the through hole H1 and the through hole H2 of the circuit substrate 60 are aligned in the direction of the X-axis, as well.

Figure 18:
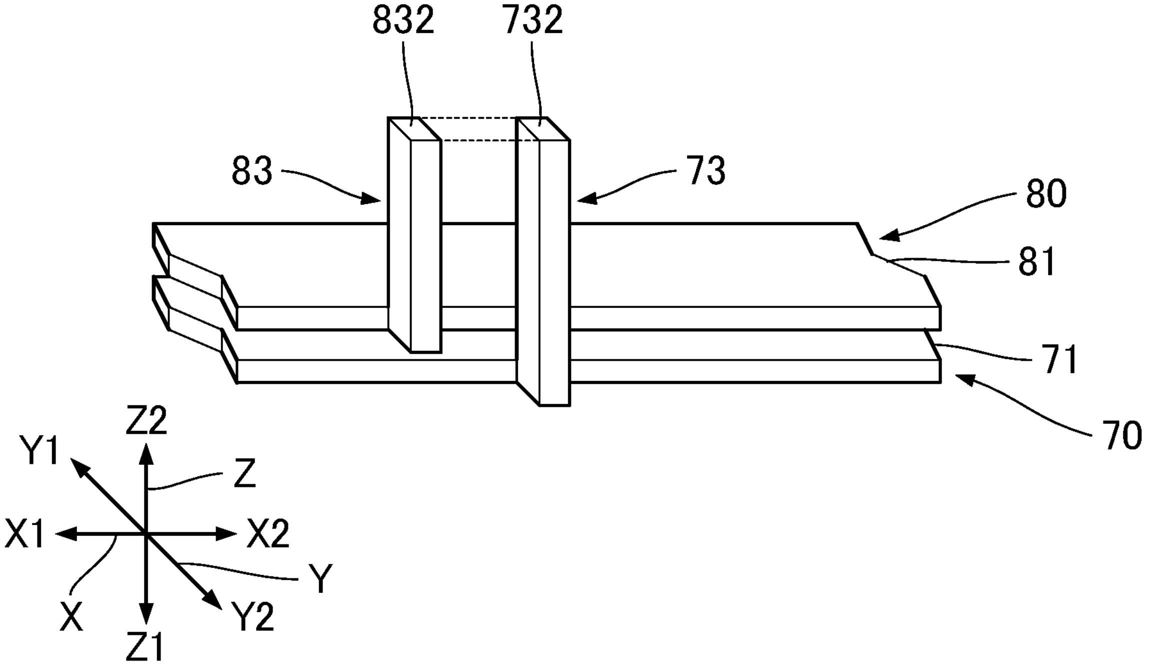
FIG. 18 is a perspective view showing the high potential bus bar and the low potential bus bar according to a modification (3).

(3) In each embodiment described above, the configuration is described in which the connector portion 73 of the high potential bus bar 70 includes the extension portion 731 and the protrusion 732; however, the extension portion 731 may be omitted. For example, as shown in FIG. 18, a configuration is assumed in which the protrusion 732 is directly coupled to the body 71 of the high potential bus bar 70. Similarly, for the low potential bus bar 80, the extension portion 831 may be omitted from the connector portion 83. For example, as shown in FIG. 18, a configuration is assumed in which the protrusion 832 is directly coupled to the body 81 of the low potential bus bar 80. In the configuration of FIG. 18, a configuration is required in which the protrusion 732 of the high potential bus bar 70 is not in contact with the low potential bus bar 80. For example, a notch may be formed at a portion, which is near the protrusion 732 of the high potential bus bar 70, of the periphery of the body 81 of the low potential bus bar 80; therefore, it is possible to avoid the protrusion 832 being in contact with the body 81. In each embodiment described above, the body 71 and the protrusion 732 are coupled to each other via the extension portion 731; therefore, compared to the configuration of FIG. 18 in which the protrusion 732 is directly connected to the body 71, it may be easy to ensure a degree of freedom in the planar position of the protrusion 732. For example, the protrusion 732 may be arranged at any position spaced apart from the body 71. The same is true for the low potential bus bar 80.

(4) In each embodiment described above, the configuration is described in which the passive element is mounted on the second surface F2 of the circuit substrate 60 that is opposite to the surface facing the mounting substrate 41; however, the passive element may be mounted on the first surface F1 of the circuit substrate 60 facing the mounting substrate 41. However, in the configuration in which the passive element is mounted on the first surface F1, it is necessary to set a sufficient space, which is required to arrange the passive element, between the mounting substrate 41 and the circuit substrate 60, or between the connecting conductor 50 and the circuit substrate 60. In each embodiment described above, the passive element is mounted on the second surface F2 of the circuit substrate 60, which is opposite to the surface facing the drive circuit 11[*k*](mounting substrate 41). Therefore, compared to the configuration in which the passive element is mounted on the first surface F1, it is possible to reduce a space required between the mounting substrate 41 and the circuit substrate 60, or between the connecting conductor 50 and the circuit substrate 60, thereby realizing the thinner semiconductor apparatus 100.

In each embodiment described above, the configuration is described in which the control circuit 13 is mounted on the second surface F2; however, the control circuit 13 may be mounted on the first surface F1 of the circuit substrate 60. In each embodiment described above, both the passive element and the control circuit 13 are mounted on the second surface F2. Therefore, according to each embodiment described above, compared to a configuration in which the passive element and the control circuit 13 are mounted on the first surface F1, the effect of being capable of reducing the space required between the mounting substrate 41 and the circuit substrate 60, or between the connecting conductor 50 and the circuit substrate 60, is particularly significant.

(5) In each embodiment described above, the configuration is described in which, whereas the protrusion 732 of the high potential bus bar 70 is inserted through the through hole H1, the protrusion 832 of the low potential bus bar 80 is inserted through the through hole H2. However, the configuration in which the protrusion 732 is inserted through the through hole H1, or the configuration in which the protrusion 832 is inserted through the through hole H2 is not necessary in the present disclosure. For example, a configuration is assumed in which, by the protrusion 732 of the high potential bus bar 70 being coupled to the first surface F1 of the circuit substrate 60, the protrusion 732 is electrically connected to the wiring pattern on the first surface F1. Similarly, a configuration is assumed in which, by the protrusion 832 of the low potential bus bar 80 being coupled to the first surface F1 of the circuit substrate 60, the protrusion 832 is electrically connected to the wiring pattern on the first surface F1.

(6) In the first embodiment, the capacitive element 15 is shown, and in the second embodiment, the series of resistors L is shown; however, both the capacitive element 15 and the series of resistors L may be mounted on the circuit substrate 60. Multiple capacitive elements 15 may be connected to each other in parallel between the protrusion 732 and the protrusion 832. The passive element mounted on the circuit substrate 60 is not limited to the capacitive element 15 or the series of resistors L. For example, an inductive element (coil) or a single resistive element, etc., may be assumed as a passive element to be mounted on the circuit substrate 60.

(7) In each embodiment described above, the configuration is described in which the control circuit 13 is constituted by the plurality of control chips 14 corresponding to the respective switching elements S; however, the control circuit 13 may be constituted by a single IC chip. Two or more of the multiple control chips 14 (14H[1] to 14H[3], 14L[1] to 14L[3]) in each of the embodiments describe above may be constituted by a single IC chip. In other words, the number of control chips 14 and the number of switching elements S may be different from each other.

(8) In each embodiment described above, the configuration is described in which an IGBT is used as the switching element S; however, a configuration of the switching element S is not limited to the example described above. For example, a metal-oxide-semiconductor field-effect transistor (MOSFET) may be used as the switching element S. In a configuration in which the switching element S is a MOSFET, the main electrode C is one of a source electrode and a drain electrode, and the main electrode E is the other of the source electrode and the drain electrode. Alternatively, a reverse conducting IGBT (RC-IGBT) including both an IBGT and a freewheeling diode (FWD) may be used as the switching element S. In a configuration in which an RC-IGBT is used, the diode elements D (DH[1] to DH[3], DL[1] to DL[3]) in each embodiment described above may be omitted.

D: Supplemental Notes

The following configurations are derivable from the different embodiments described above.

A semiconductor apparatus according to one aspect (first aspect) of the present disclosure includes a first connection terminal and a second connection terminal, a drive circuit including one or more power semiconductor elements, a control circuit configured to control the one or more power semiconductor elements, a circuit substrate, a passive element on the circuit substrate, and a first bus bar and a second bus bar. The first bus bar includes a first body including a path electrically connecting the first connection terminal to the drive circuit, and a first protrusion protruding toward the circuit substrate against the first body. The second bus bar includes a second body including a path electrically connecting the second connection terminal and the drive circuit, and a second protrusion protruding toward the circuit substrate against the second body. The passive element is electrically connected to the first protrusion and to the second protrusion.

According to the aspect described above, the first protrusion included in the first bus bar and the second protrusion included in the second bus bar are electrically connected to the passive element on the circuit substrate. Therefore, independent elements for electrically connecting each of the first connection terminal and the second connection terminal to the passive element are not necessary. According to the aspect described above, for example, compared to a configuration in which the first connection terminal and the second connection terminal are electrically connected to the passive element by a dedicated element (for example, a linear connecting conductor), the manufacture of the semiconductor apparatus is simplified.

The "bus bar (first bus bar/second bus bar)" is a plate-shaped or bar-shaped conductor for conducting a large current. For example, a lead frame (lead) formed from a metal plate may be included in a concept of "bus bar" in this disclosure.

A configuration in which an element A and an element B are "electrically connected" to each other includes not only a configuration in which the element A and the element B are directly connected to each other, but also a configuration in which the element A and the element B are indirectly connected to each other through a conductor.

With respect to the first protrusion, "the first protrusion protruding toward the circuit substrate against the first body" means a configuration in which the first protrusion protrudes from a plane including a surface of the first body in a direction approaching the circuit substrate. In the present disclosure, the first protrusion and the first body may be directly coupled to each other, alternatively, the first protrusion and the first body may be indirectly coupled to each other via other elements (for example, a first extension portion described below). Although the above description focuses on the first bus bar, the same interpretation may apply to the second bus bar.

In an example (second aspect) of the first aspect, the semiconductor apparatus further includes a mounting substrate on which the drive circuit is mounted. The first body and the second body are located between the mounting substrate and the circuit substrate. The first bus bar further includes a first connector portion protruding toward the mounting substrate against the first body, the first connector portion being electrically connected to the drive circuit. The second bus bar further includes a second connector portion protruding toward the mounting substrate against the second body, the second connector portion being electrically connected to the drive circuit. Each of the first protrusion and the second protrusion is electrically connected to the passive element in a situation in which each of the first protrusion and the second protrusion is fixed to the circuit substrate. According to the aspect described above, the first body of the first bus bar and the second body of the second bus bar are located between the mounting substrate and the circuit substrate. In other words, the mounting substrate, the first body, the second body, and the circuit substrate are stacked. Therefore, compared to a configuration in which the first body and the second body do not overlap with the mounting substrate or the circuit substrate in plan view, it is possible to reduce the planar size of the semiconductor apparatus.

In an example (third aspect) of the first aspect or the second aspect, at least a part of the first body and at least a part of the second body overlap in plan view. According to the aspect described above, the at least the part of the first body and the at least the part of the second body overlap in plan view; therefore, compared to a configuration in which the first body and the second body do not overlap in plan view, it is possible to reduce inductive components from current paths of the semiconductor apparatus. The term "plan view" means viewing a target from a direction perpendicular to a substrate surface (upper surface or lower surface) of the circuit substrate.

The first body and the second body overlap entirely or partially in plan view. For example, a configuration is assumed in which the first body and the second body overlap in plan view at the center portion of each of the first body and the second body in the direction in which the first body or the second body extends.

In an example (fourth aspect) of any one of the first to the third aspects, the circuit substrate includes a first through hole and a second through hole, the first protrusion is through the first through hole, and the second protrusion is through the second through hole. According to the aspect described above, the first protrusion is inserted through the first through hole and the second protrusion is inserted through the second through hole. Therefore, it is possible to fix the first protrusion and the second protrusion to the circuit substrate easily.

In an example (fifth aspect) of any one of the first to the fourth aspects, the circuit substrate includes a first surface facing the drive circuit; and a second surface opposite to the first surface, and the passive element is on the second surface. According to the aspect described above, the passive element is mounted on the second surface of the circuit substrate, which is opposite to the first surface facing the drive circuit. Therefore, compared to a configuration in which the passive element is mounted on the first surface, it is possible to reduce a space required between the drive circuit and the circuit substrate.

In an example (sixth aspect) of the fifth aspect, the control circuit is on the second surface. According to the aspect described above, both the passive element and the control circuit are mounted on the second surface of the circuit substrate, which is opposite to the first surface facing the drive circuit. Therefore, compared to a configuration in which the control circuit is mounted on the first surface, an effect of being capable of reducing a space required between the drive circuit and the circuit substrate, is particularly significant.

In an example (seventh aspect) of any one of the first to the sixth aspects, the control circuit includes a plurality of control chips on the circuit substrate, the passive element is at a center of the circuit substrate, and the plurality of control chips is arranged, along a periphery of the circuit substrate, at an area surrounding the passive element. According to the aspect described above, the multiple control chips are arranged around the passive element along a periphery of the circuit substrate; therefore, it is possible to reduce respective differences between respective distances (electrical path length) between the respective control chips and the passive element. Therefore, compared to a configuration in which the passive element is located near the periphery of the circuit substrate, it is possible to efficiently realize effects of using the passive element (reduction in noise or detection of unusual voltage).

In an example (eighth aspect) of any one of the first to the seventh aspects, the passive element overlaps neither the first body nor the second body in plan view. Heat generated in the power semiconductor element due to an operation of the semiconductor apparatus may spread to the first bus bar or the second bus bar. In a configuration in which the passive element overlaps the first body or the second body in plan view, heat from the first bus bar or the second bus bar may reach the passive element. On the other hand, according to the aforementioned configuration in which the passive element overlaps neither the first body nor the second body in plan view, it is difficult for heat from the first bus bar or the second bus bar to reach the passive element. Therefore, change in the electrical characteristics of the capacitive element due to heating are reduced, and consequently, malfunctions of the semiconductor apparatus due to the change in electrical characteristics of the passive element are reduced.

In an example (ninth aspect) of any one of the first to the eighth aspects, the first bus bar further includes a first extension portion extending from the first body in a direction along a substrate surface of the circuit substrate, the first protrusion protrudes from a tip of the first extension portion toward the circuit substrate, the second bus bar further includes a second extension portion extending from the second body in the direction along the substrate surface of the circuit substrate, and the second protrusion protrudes from a tip of the second extension portion toward the circuit substrate. According to the aspect described above, the first body and the first protrusion are coupled to each other via the first extension portion; therefore, it is possible to maintain a high level of degree of freedom in the planar position of the first protrusion. For example, the first protrusion may be arranged at a position spaced apart from the first body. The same is true for the second bus bar.

In an example (tenth aspect) of any one of the first to the ninth aspects, the first protrusion is a portion bent from the first extension portion, and the second protrusion is a portion bent from the second extension portion. According to the aspect described above, the first protrusion is formed by bending a portion continuous with the first extension portion. Therefore, for example, it is possible to form the first protrusion with ease compared to a configuration in which the first protrusion, which is separate from the first extension portion, is coupled to the first extension portion. The same is true for the second protrusion.

In an example (eleventh aspect) of any one of the first to the tenth aspects, the circuit substrate includes a first portion and a second portion that are spaced from each other; and a coupler portion coupling the first portion to the second portion, and the passive element is on the coupler portion. According to the aspect described above, the passive element is mounted on the coupling portion coupling the first portion and the second portion of the circuit substrate. In other words, it is possible for the portion coupling the first portion and the second portion to be effectively used for the arrangement of the passive element.

In an example (twelfth aspect) of the eleventh aspect, a first opening and a second opening are located between the first portion and the second portion, and the coupler portion is located between the first opening and the second opening. According to the aspect described above, it is possible to inject a resin material for encapsulating the drive circuit through the first opening or the second opening. In addition, the coupling portion is formed between the first opening and the second opening; therefore, it is easy to maintain the mechanical strength of the circuit substrate.

In an example (thirteenth aspect) of any one of the first to the twelfth aspects, the passive elements includes a capacitive element including a first electrode electrically connected to the first protrusion; and a second electrode electrically connected to the second protrusion. According to the aspect described above, it is possible to change the frequency characteristics of noise caused by switching the power semiconductor element (for example, noise can be reduced).

In an example (fourteenth aspect) of any one of the first to the thirteenth aspects, the passive element includes a series of resistors including a plurality of resistive elements connected in series, a first end of the series of resistors is electrically connected to the first protrusion, a second end of the series of resistors opposite to the first end is electrically connected to the second protrusion, and the semiconductor apparatus further comprising a detection line connected between a first resistive element and a second resistive element, the first resistive element and the second resistive element being included in the plurality of resistive elements, the first resistive element and the second resistive element being adjacent to each other. According to the aspect described above, a voltage, which is obtained by dividing a voltage between the first connection terminal and the second connection terminal by the plurality of resistive elements, is detected by the detection line. Therefore, it is possible to detect an unusual state (or even an occurrence of an unusual state) of the voltage between the first connection terminal and the second connection terminal.

DESCRIPTION OF REFERENCE SIGNS

100 . . . semiconductor apparatus, 11 . . . drive circuit, 13 . . . control circuit, 14 . . . control chip, 15 . . . capacitive element, 151 . . . first electrode, 152 . . . second electrode, 16 . . . resistive element, 17 . . . detection line, 18 . . . detection circuit, 181 . . . reference voltage source, 182 . . . comparison circuit, 21 . . . base, 22 . . . lid, 30 . . . housing, 31 to 34 . . . side wall, 35, 36 . . . overhang, 37 . . . support, 38 . . . control terminal, 39 . . . external terminal, 40 . . . semiconductor unit, 41 . . . mounting substrate, 42 . . . insulating substrate, 43 . . . metal layer, 44 . . . conductive pattern, 45 . . . mounting area, 50 . . . connecting conductor, 54 . . . output side bus bar, 55 . . . extension portion, 56 . . . terminal portion, 58 . . . spacer, 60 . . . circuit substrate, 61 . . . first portion, 62 . . . second portion, 63 to 65 . . . coupler portion, 66, 67 . . . opening, F1 . . . first surface, F2 . . . second surface, H1, H2, Ha, Hb . . . through hole, 70 . . . high potential bus bar, 71 . . . body, 72 . . . connector portion, 73 . . . connector portion, 731 . . . extension portion, 732 . . . protrusion, 80 . . . low potential bus bar, 81 . . . body, 82 . . . connector portion, 83 . . . connector portion, 831 . . . extension portion, 832 . . . protrusion, 84, 85 . . . coupler portion, 200 . . . control apparatus, 681 to 685 . . . wiring pattern, P, N . . . connecting terminal, D . . . diode element, S . . . switching element, V . . . detection voltage, Vref . . . reference voltage, e1 . . . first end, e2 . . . second end, a . . . warning signal.

What is claimed is:

1. A semiconductor apparatus comprising:

a first connection terminal and a second connection terminal;

a drive circuit including one or more power semiconductor elements;

a control circuit configured to control the one or more power semiconductor elements;

a circuit substrate;

a passive element on the circuit substrate; and a first bus bar and a second bus bar, wherein:

the first bus bar includes:

a first body including a path electrically connecting the first connection terminal to the drive circuit; and a first protrusion protruding toward the circuit substrate against the first body, the second bus bar includes:

a second body including a path electrically connecting the second connection terminal and the drive circuit; and a second protrusion protruding toward the circuit substrate against the second body, and the passive element is electrically connected to the first protrusion and to the second protrusion.

2. The semiconductor apparatus according to claim 1, further comprising a mounting substrate on which the drive circuit is mounted, wherein:

the first body and the second body are located between the mounting substrate and the circuit substrate, the first bus bar further includes a first connector portion protruding toward the mounting substrate against the first body, the first connector portion being electrically connected to the drive circuit, the second bus bar further includes a second connector portion protruding toward the mounting substrate against the second body, the second connector portion being electrically connected to the drive circuit, each of the first protrusion and the second protrusion is electrically connected to the passive element in a situation in which each of the first protrusion and the second protrusion is fixed to the circuit substrate.

3. The semiconductor apparatus according to claim 1, wherein at least a part of the first body and at least a part of the second body overlap in plan view.

4. The semiconductor apparatus according to claim 1, wherein:

the circuit substrate includes a first through hole and a second through hole, the first protrusion is through the first through hole, the second protrusion is through the second through hole.

5. The semiconductor apparatus according to claim 1, wherein:

the circuit substrate includes:

a first surface facing the drive circuit; and a second surface opposite to the first surface, the passive element is on the second surface.

6. The semiconductor apparatus according to claim 5, wherein the control circuit is on the second surface.

7. The semiconductor apparatus according to claim 1, wherein:

the control circuit includes a plurality of control chips on the circuit substrate, the passive element is at a center of the circuit substrate, the plurality of control chips is arranged, along a periphery of the circuit substrate, at an area surrounding the passive element.

8. The semiconductor apparatus according to claim 1, wherein the passive element overlaps neither the first body nor the second body in plan view.

9. The semiconductor apparatus according to claim 1, wherein:

the first bus bar further includes a first extension portion extending from the first body in a direction along a substrate surface of the circuit substrate, the first protrusion protrudes from a tip of the first extension portion toward the circuit substrate, the second bus bar further includes a second extension portion extending from the second body in the direction along the substrate surface of the circuit substrate, and the second protrusion protrudes from a tip of the second extension portion toward the circuit substrate.

10. The semiconductor apparatus according to claim 9, wherein:

the first protrusion is a portion bent from the first extension portion, the second protrusion is a portion bent from the second extension portion.

11. The semiconductor apparatus according to claim 1, wherein:

the circuit substrate includes:

a first portion and a second portion that are spaced from each other; and a coupler portion coupling the first portion to the second portion, and the passive element is on the coupler portion.

12. The semiconductor apparatus according to claim 11, wherein:

a first opening and a second opening are located between the first portion and the second portion, and the coupler portion is located between the first opening and the second opening.

13. The semiconductor apparatus according to claim 1, wherein the passive elements includes a capacitive element including:

a first electrode electrically connected to the first protrusion; and a second electrode electrically connected to the second protrusion.

14. The semiconductor apparatus according to claim 1, wherein:

the passive element includes a series of resistors including a plurality of resistive elements connected in series, a first end of the series of resistors is electrically connected to the first protrusion, a second end of the series of resistors opposite to the first end is electrically connected to the second protrusion, and the semiconductor apparatus further comprising a detection line connected between a first resistive element and a second resistive element, the first resistive element and the second resistive element being included in the plurality of resistive elements, the first resistive element and the second resistive element being adjacent to each other.

* * * * *